US009322881B2

(12) United States Patent
Sakurai et al.

(10) Patent No.: US 9,322,881 B2
(45) Date of Patent: Apr. 26, 2016

(54) PARTIAL DISCHARGE MEASUREMENT SYSTEM AND PARTIAL DISCHARGE MEASUREMENT METHOD BY REPEATED IMPULSE VOLTAGE

(71) Applicants: TOSHIBA MITSUBISHI-ELECTRIC INDUSTRIAL SYSTEMS CORPORATION, Tokyo (JP); KABUSHIKI KAISHA TOSHIBA, Tokyo (JP)

(72) Inventors: Takayuki Sakurai, Tokyo (JP); Hiroyuki Ogawa, Tokyo (JP); Tetsuo Yoshimitsu, Tokyo (JP); Tatsuya Hirose, Inagi (JP); Satoshi Hiroshima, Kawasaki (JP)

(73) Assignees: TOSHIBA MITSUBISHI-ELECTRIC INDUSTRIAL SYSTEMS CORPORATION, Tokyo (JP); KABUSHIKI KAISHA TOSHIBA, Tokyo (JP)

( * ) Notice: Subject to any disclaimer, the term of this patent is extended or adjusted under 35 U.S.C. 154(b) by 48 days.

(21) Appl. No.: 14/384,759

(22) PCT Filed: Mar. 13, 2013

(86) PCT No.: PCT/JP2013/001674
§ 371 (c)(1),
(2) Date: Sep. 12, 2014

(87) PCT Pub. No.: WO2013/136793
PCT Pub. Date: Sep. 19, 2013

(65) Prior Publication Data
US 2015/0015303 A1    Jan. 15, 2015

(30) Foreign Application Priority Data

Mar. 14, 2012  (JP) .................................. 2012-057197

(51) Int. Cl.
*G01R 31/34*      (2006.01)
*G01R 31/14*      (2006.01)
(Continued)

(52) U.S. Cl.
CPC .......... *G01R 31/343* (2013.01); *G01R 19/0084* (2013.01); *G01R 31/14* (2013.01); *G01R 31/1272* (2013.01)

(58) Field of Classification Search
CPC .. G01R 31/14; G01R 31/343; G01R 31/1272; G01R 19/84
See application file for complete search history.

(56) References Cited

U.S. PATENT DOCUMENTS 5,648,725 A   7/1997  Divljakovic et al.
5,963,410 A  10/1999  Iijima et al.
(Continued)

FOREIGN PATENT DOCUMENTS

DE    102 26 615 A1   1/2004
JP    S 59-52410      4/1984
(Continued)

OTHER PUBLICATIONS

Extended European Search Report issued Oct. 9, 2015 in Patent Application No. 13761865.8.
(Continued)

*Primary Examiner* — Minh N Tang
(74) *Attorney, Agent, or Firm* — Oblon, McClelland, Maier & Neustadt, L.L.P.

(57) ABSTRACT

An impulse voltage generator uses a predetermined rectangular waveform signal and a high voltage to generate an impulse voltage. The high voltage is obtained by boosting an instruction voltage of the rectangular waveform signal on a per-cycle basis. A partial discharge frequency calculation section receives detection signals based on partial discharges occurring in an object to be measured by the application of the impulse voltage and counts the detection signal on a per-cycle basis as a partial discharge frequency. An application voltage signal observation circuit observes an application voltage signal indicating the impulse voltage applied to the object to be measured. In a first cycle in which the partial discharge frequency reaches a specified frequency or more, a voltage value acquiring section sets, as a partial discharge starting voltage, the peak value of the voltage indicated by the application voltage signal output from the application voltage signal observation circuit.

10 Claims, 20 Drawing Sheets

(51) Int. Cl.
*G01R 19/00* (2006.01)
*G01R 31/12* (2006.01)

(56) References Cited

U.S. PATENT DOCUMENTS

| | | | |
|---|---|---|---|
| 6,051,980 A | | 4/2000 | Divljakovic et al. |
| 6,242,900 B1 * | | 6/2001 | Fawcett ................. G01R 31/12 324/520 |
| 6,313,640 B1 * | | 11/2001 | Nasrallah ........... G01R 31/1272 324/522 |
| 2011/0320146 A1 * | | 12/2011 | Watanabe ............ G01R 31/343 702/65 |

FOREIGN PATENT DOCUMENTS

| | | |
|---|---|---|
| JP | 8-204455 A | 8/1996 |
| JP | 9 257862 | 10/1997 |
| JP | 10-335089 A | 12/1998 |
| JP | 2002-169200 A | 6/2002 |
| JP | 2003-219677 A | 7/2003 |
| JP | 2006 38471 | 2/2006 |
| JP | 2006-38688 A | 2/2006 |
| JP | 2009 115505 | 5/2009 |
| JP | 2010-281673 A | 12/2010 |
| WO | WO 2009/013640 A1 | 1/2009 |

OTHER PUBLICATIONS

K. Kimura, et al., "Round-Robin Test on Repetitive PD Inception Voltage of Twisted-Pairs" 2010 Annual Report Conference on Electrical Insulation and Dielectric Phenomena (CEIDP), IEEE, XP031986216, 2010, 4 pages.

Office Action issued on Jul. 14, 2015 in Japanese Patent Application No. 2012-057197.

Kimura, K., et al."The First Round-Robin Test for Repetitive Partial Discharge Inception Voltage (RPDIV)" Institute of Electrical Engineers of Japan "40$^{th}$ Symposium on Electric and Electronic Insulating Materials and Applications in System D-1", pp. 95-98, (Aug. 2009) (with partial English translation).

Nakanishi, K., et al. "Effect of humidity and atmosphere pressure on repetitive partial discharge inception voltage (RPDIV) obtained by automatic measurement system", Institute of Electrical Engineers of Japan "40$^{th}$ Symposium on Electric and Electronic Insulating Materials and Applications in System P-7", pp. 175-176, (Aug. 2009).

International Search Report Issued May 7, 2013 in PCT/JP13/001674 Filed Mar. 13, 2013.

International Preliminary Report on Patentability and Written Opinion issued Sep. 25, 2014 in PCT/JP2013/001674 (English Translation only).

Office Action issued Nov. 24, 2015 in Japanese Patent Application No. 2012-057197 (with English translation).

Takeshi Kamura, "IEC standards on PD inception voltage under repetitive impulses" Material for Discharge Research Workshop of Japanese Institute of Electrical Engineers, Ed. 10, 125-130, Dec. 2, 2010, pp. 13-17.

Office Action mailed Jan. 11, 2016 in Canadian Patent Application No. 2,867,198.

* cited by examiner

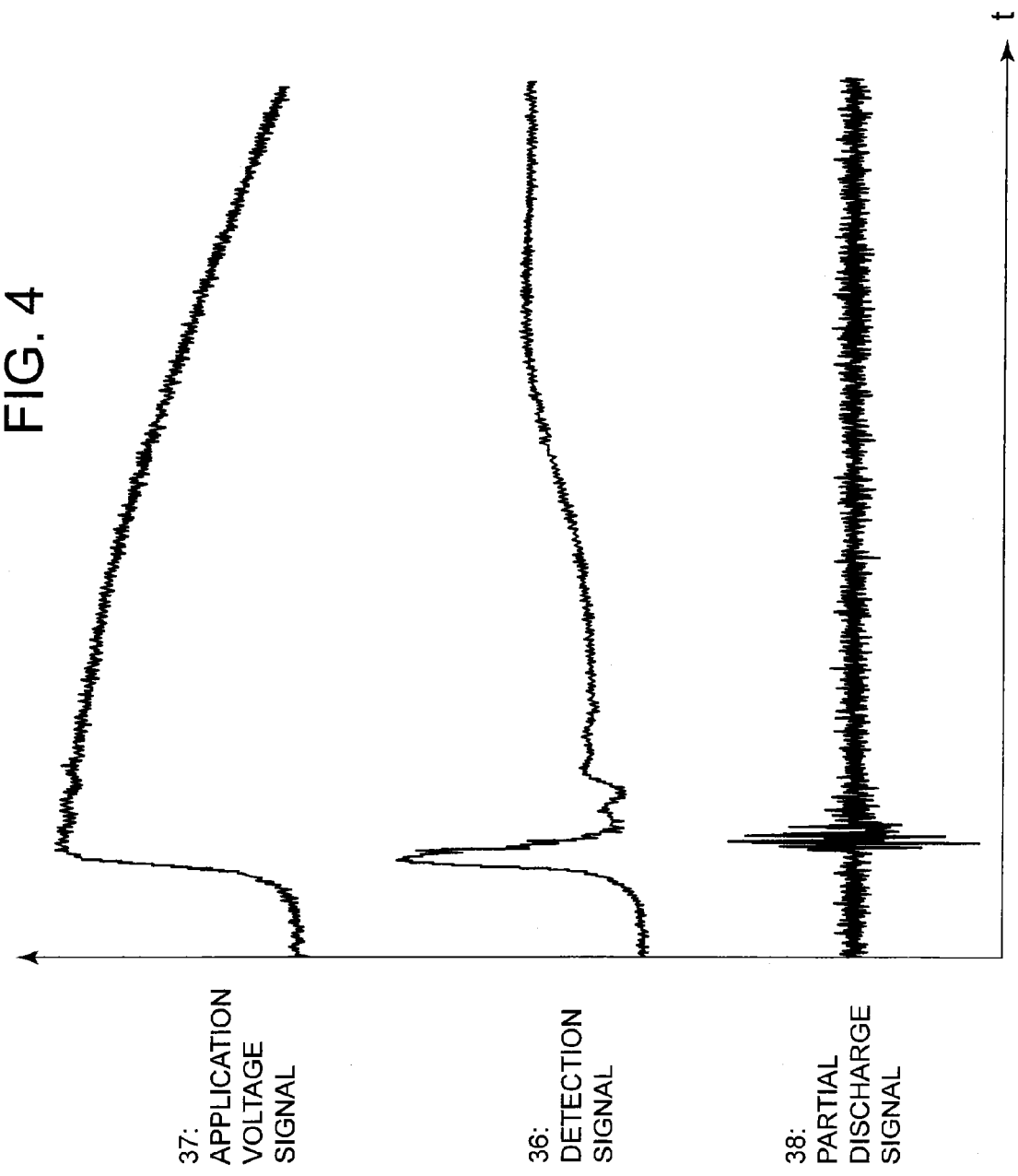

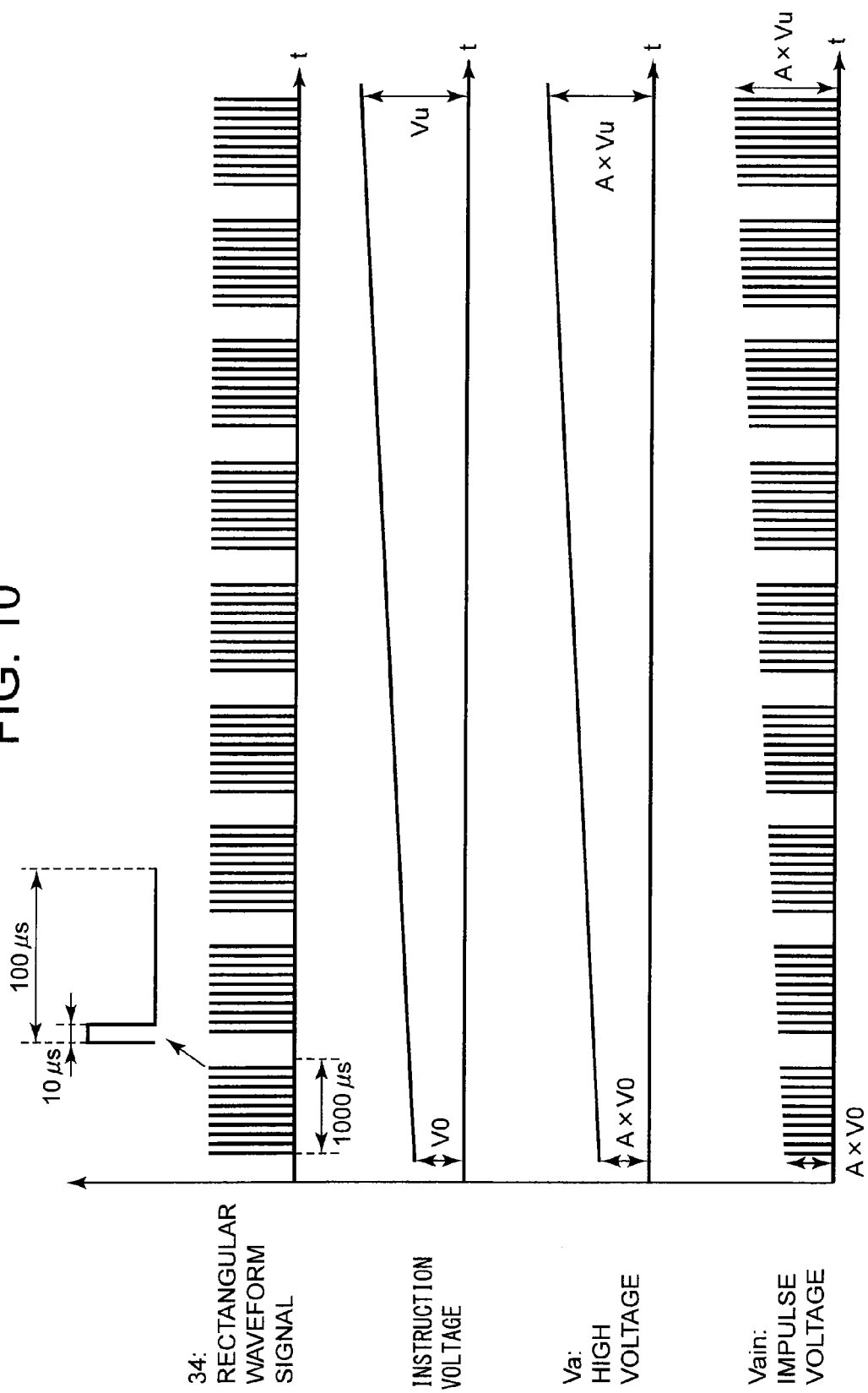

PARTIAL DISCHARGE MEASUREMENT SYSTEM AND PARTIAL DISCHARGE MEASUREMENT METHOD BY REPEATED IMPULSE VOLTAGE

TECHNICAL FIELD

The present invention relates to a partial discharge measurement system and a partial discharge measurement method based on repeated impulse voltage.

BACKGROUND ART

It is widely known that when an electric motor is inverter-driven, a surge voltage due to high-speed switching in an inverter is generated to affect insulation of a motor winding. Such a surge voltage is called "inverter surge" and may sometimes reach double or more the rated voltage. When the inverter surge is applied to the motor winding, a partial discharge may occur inside or outside the winding. Such a partial discharge may cause degradation of coating of an enamel wire constituting the winding. Degradation of the coating may lead to insulation breakdown. Thus, there is desired an insulation design of the electric motor that prevents the partial discharge from occurring even when the inverter surge is applied to the winding.

Conventionally, insulation performance of the motor winding is evaluated based on partial discharge characteristics obtained by application of an ordinary alternate voltage, especially, a partial discharge starting voltage. However, a potential distribution in the winding differs between when the ordinary alternate voltage is applied and when the surge voltage is applied. Therefore, the insulation performance of the inverter-driven electric motor is desirably evaluated by application of an impulse voltage simulating the surge voltage. Further, in partial discharge measurement conducted by application of the impulse voltage, voltage changes steeply at rising time (at application start time) of the impulse voltage, so that there is required a different approach from the partial discharge measurement conducted by application of the ordinary alternate voltage.

Non-Patent Document 1 describes a guideline of a partial discharge measurement method that repeatedly applies the impulse voltage in one period. More specifically, Non-Patent Document 1 defines that an impulse voltage applied when a partial discharge frequency, which is the number of the partial discharges, with respect to the number of all the applied impulse voltages (hereinafter, referred to as "number of impulses") reaches a specified frequency or more is regarded as a partial discharge starting voltage, which is called a partial discharge starting voltage in repeated impulse voltage.

Further, Non-Patent Documents 2 and 3 describe a partial discharge measurement method (all-period partial discharge measurement method) that repeatedly applies the impulse voltage for all periods. The following more specifically describes the all-period partial discharge measurement method.

FIG. 12 is a timing chart of the all-period partial discharge measurement method, illustrating an impulse voltage to be applied for each period (data segment in the drawing) to a twist pair sample simulating the winding of the electric motor and a partial discharge signal representing the partial discharge generated in the electric motor to which the impulse voltage is applied. As illustrated in FIG. 12, in the all-period partial discharge measurement method, one period includes a pulse supply period and a pulse pause period following the pulse supply period. In the first period, ten impulse voltages are applied during the pulse supply period (e.g., 20 ms) and application of the impulse voltage is stopped during the pulse pause period (e.g., 100 ms). Subsequently, in the second period, ten 10 V boosted impulse voltage are applied during the pulse supply period, and application of the impulse voltage is stopped during the pulse pause period. Such processing is repeated for all periods until a starting value (e.g., 1 kV) of a peak value of the impulse voltage reaches a stop value (e.g., 2 kV).

In the all-period partial discharge measurement method, in all the periods, an applied voltage signal representing the impulse voltage and the above-mentioned partial discharge signal are stored in a memory. Thereafter, an operator verifies, on a per-period basis, whether or not the partial discharge frequency is a specified frequency or more (e.g., five or more) and defines, as the partial discharge starting voltage, the impulse voltage applied to the twist pair sample in a period in which the partial discharge frequency first reaches a specified frequency or more. That is, in the all-period partial discharge measurement method, application of the impulse voltage and measurement of the partial discharge are continuously performed for all periods from the start of the application of the impulse voltage to stop thereof, and the partial discharge starting voltage is derived after completion of the measurement.

Further, in Non-Patent Document 2, a voltage increment of the impulse voltage to be boosted every period is set to be 10 V. Further, in one period, an interval between one impulse voltage and the subsequent impulse voltage in the pulse supply period is set to be 20 ms, and the pulse pause period is set to be 100 ms. The above settings are based on the specification of an impulse voltage generator to be used and cannot be set arbitrarily by a user.

PRIOR ART DOCUMENTS

Non-Patent Documents

Non-Patent Document 1: IEC 61934TS
Non-Patent Document 2: Institute of Electrical Engineers of Japan "40th Symposium on Electric and Electronic Insulating Materials and Applications in System D-1" August 2009
Non-Patent Document 3: Institute of Electrical Engineers of Japan "40th Symposium on Electric and Electronic Insulating Materials and Applications in System P-7" August 2009

SUMMARY OF THE INVENTION

Problems to be Solved by the Invention

An object of the present invention is to provide a partial discharge measurement system based on repeated impulse voltage, capable of allowing a user to set an arbitrary impulse voltage and reducing user's work.

Means for Solving the Problems

According to the present invention, there is provided a partial discharge measurement system based on repeated impulse voltage, the system comprising: a DC power supply that outputs high voltage as a voltage obtained by multiplying an instruction voltage by a set factor; a signal generator that generates a pulse signal representing a predetermined pulse width and a predetermined pulse repetition frequency, and superimposes a period setting signal whose one period includes a pulse supply period and a pulse pause period following the pulse supply period and the pulse signal on each other to generate a rectangular waveform signal in which a predetermined number of the pulse signals are generated only in the pulse supply period; a semiconductor switch that charges a capacitive element with the high voltage from the DC power supply when a voltage value of the rectangular waveform signal is lower than a preset voltage threshold, while applies an impulse voltage having a peak value equal to a value of the high voltage from the capacitive element to an object to be measured when the voltage value of the rectangular waveform signal is equal to or higher than the voltage threshold; a signal instruction section that outputs, to the signal generator, a square wave instruction signal in which the predetermined pulse width, the predetermined pulse repetition frequency, and the predetermined number are set; a voltage instruction section that outputs, to the DC power supply, a voltage instruction signal in which an initial voltage is set as the instruction voltage in a first period of the rectangular waveform signal and sets in the voltage instruction signal, in second and subsequent periods, a voltage obtained by adding a predetermined increment voltage lower than the initial voltage to the instruction voltage in the immediately previous period as the instruction voltage; a detection signal observation circuit that observes a detection signal based on a partial discharge generated in the object to be measured to which the impulse voltages are applied; a partial discharge frequency calculation section that counts the number of inputs of the detection signal on a per period basis as a partial discharge frequency; an application voltage signal observation circuit that observes an application voltage signal representing the impulse voltage to be applied to the object to be measured; and a voltage value acquiring section that sets, in a period in which the partial discharge frequency first becomes equal to or more than a specified frequency, a peak value of a voltage represented by the application voltage signal from the application voltage observation circuit as a partial discharge starting voltage.

According to the present invention, there is provided a measurement device for a partial discharge measurement system based on repeated impulse voltage, the system including: a DC power supply that outputs high voltage as a voltage obtained by multiplying an instruction voltage by a set factor; a signal generator that generates a pulse signal representing a predetermined pulse width and a predetermined pulse repetition frequency and superimposes a period setting signal whose one period includes a pulse supply period and a pulse pause period following the pulse supply period and the pulse signal on each other to generate a rectangular waveform signal in which a predetermined number of the pulse signals are generated only in the pulse supply period; and a semiconductor switch that charges a capacitive element with the high voltage from the DC power supply when a voltage value of the rectangular waveform signal is lower than a preset voltage threshold, while applies an impulse voltage having a peak value equal to a value of the high voltage from the capacitive element to an object to be measured when the voltage value of the rectangular waveform signal is equal to or higher than the voltage threshold, the measurement device comprising: a signal instruction section that outputs, to the signal generator, a square wave instruction signal in which the predetermined pulse width, the predetermined pulse repetition frequency, and the predetermined number are set; a voltage instruction section that outputs, to the DC power supply, a voltage instruction signal in which an initial voltage is set as the instruction voltage in a first period of the rectangular waveform signal and sets in the voltage instruction signal, in second and subsequent periods, a voltage obtained by adding a predetermined increment voltage lower than the initial voltage to the instruction voltage in the immediately previous period as the instruction voltage; a detection signal observation circuit that observes a detection signal based on a partial discharge generated in the object to be measured to which the impulse voltages are applied; a partial discharge frequency calculation section that counts the number of inputs of the detection signal on a per period basis as a partial discharge frequency; an application voltage signal observation circuit that observes an application voltage signal representing the impulse voltage to be applied to the object to be measured; and a voltage value acquiring section that sets, in a period in which the partial discharge frequency first becomes equal to or more than a specified frequency, a peak value of a voltage represented by the application voltage signal from the application voltage observation circuit as a partial discharge starting voltage.

According to the present invention, there is provided a measurement method for a partial discharge measurement system based on repeated impulse voltage, the system including: a DC power supply that outputs high voltage as a voltage obtained by multiplying an instruction voltage by a set factor; a signal generator that generates a pulse signal representing a predetermined pulse width and a predetermined pulse repetition frequency, and superimposes a period setting signal whose one period includes a pulse supply period and a pulse pause period following the pulse supply period and the pulse signal on each other to generate a rectangular waveform signal in which a predetermined number of the pulse signals are generated only in the pulse supply period; and a semiconductor switch that charges a capacitive element with the high voltage from the DC power supply when a voltage value of the rectangular waveform signal is lower than a preset voltage threshold, while applies an impulse voltage having a peak value equal to a value of the high voltage from the capacitive element to an object to be measured when the voltage value of the rectangular waveform signal is equal to or higher than the voltage threshold, the measurement method comprising steps of: outputting, to the signal generator, a square wave instruction signal in which the predetermined pulse width, the predetermined pulse repetition frequency, and the predetermined number are set; outputting, to the DC power supply, a voltage instruction signal in which an initial voltage is set as the instruction voltage in a first period of the rectangular waveform signal, and setting in the voltage instruction signal, in second and subsequent periods, a voltage obtained by adding a predetermined increment voltage lower than the initial voltage to the instruction voltage in an immediately previous period as the instruction voltage; observing, using a detection signal observation circuit, a detection signal based on a partial discharge generated in the object to be measured to which the impulse voltages are applied; counting the number of inputs of the detection signal on a per period basis as a partial discharge frequency; observing, using an application voltage signal observation circuit, an application voltage signal representing the impulse voltage to be applied to the object to be measured; and setting, in a period in which the partial discharge frequency first becomes equal to or more than a specified frequency, a peak value of a voltage represented by the application voltage signal from the application voltage observation circuit as a partial discharge starting voltage.

Advantage of the Present Invention

According to the present invention, the user can set an arbitrary impulse voltage and the user's work can be reduced.

BRIEF DESCRIPTION OF THE DRAWINGS

FIG. 4 is a timing chart illustrating waveforms of an application voltage signal 37, a detection signal 36, and a partial discharge signal 38 obtained by applying digital filtering to the detection signal 36.

FIG. 10 is a timing chart illustrating the rectangular waveform signal 34, instruction voltage of the ramp output, high voltage Va, and impulse voltage Vain.

EMBODIMENTS FOR CARRYING OUT THE INVENTION

Hereinafter, embodiments of a partial discharge measurement system based on repeated impulse voltage according to the present invention will be described with reference to the drawings.

(First Embodiment)

Figure 1:
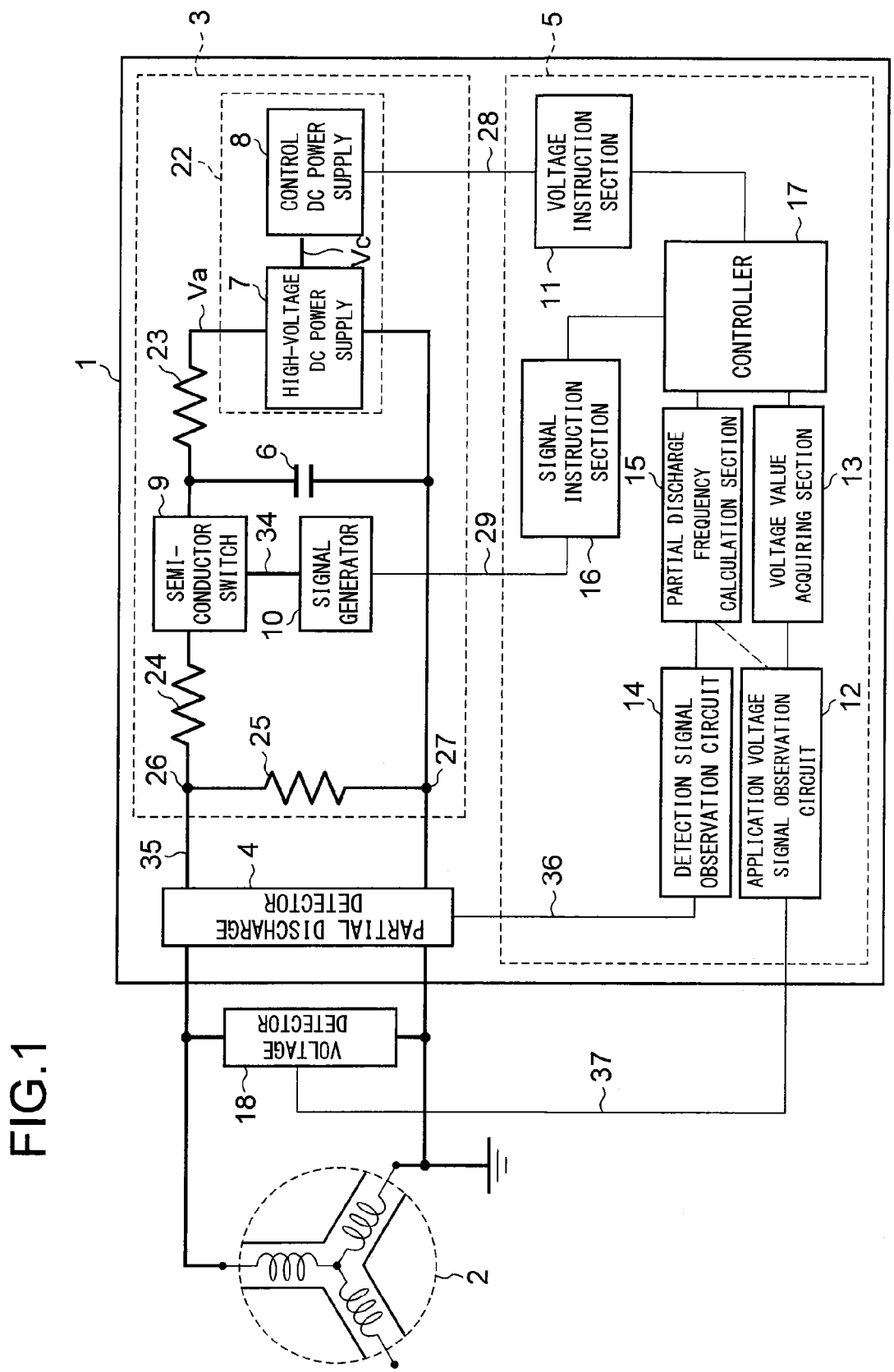
FIG. 1 is a block diagram illustrating a schematic configuration of a partial discharge measurement system according to a first embodiment.

FIG. 1 is a block diagram illustrating a schematic configuration of a partial discharge measurement system according to a first embodiment. A partial discharge measurement system 1 illustrated in FIG. 1 applies repeated impulse voltage to an electric motor 2 which is an object to be measured to measure a partial discharge in the repeated impulse voltage. The partial discharge measurement system 1 includes an impulse voltage generator 3, a partial discharge detector 4, a measurement device 5, and a voltage detector 18.

The impulse voltage generator 3 includes a capacitor 6 as a capacitive element, a DC power supply 22, a semiconductor switch 9, a signal generator 10, resistive elements 23 to 25, and output terminals 26 and 27. The DC power supply 22 includes a high-voltage DC power supply 7 and a control DC power supply 8.

An output of the high-voltage DC power supply 7 is connected to a first electrode of the capacitor 6. A second electrode 2 of the capacitor 6 has the same potential as that of the output terminal 27. More specifically, the output terminal 27 is grounded. An output of the control DC power supply 8 is connected to an input port (not illustrated) of the high-voltage DC power supply 7.

The resistive element 23 is provided between the output of the high-voltage DC power supply 7 and the first electrode of the capacitor 6. The resistive element 25 is provided between the output terminals 26 and 27. For example, a section between phases (e.g., U and V phases) of a winding of the electric motor 2 is provided as a load for supplying an impulse voltage Vain. The load is not limited to the illustrated section between phases of the winding of the electric motor 2 but may be other sections between phases or a section between the winding and the iron core of the electric motor 2.

The semiconductor switch 9 includes a first terminal (not illustrated) connected to the first electrode of the capacitor 6, a second terminal (not illustrated) connected to the output terminal 26, and a gate terminal (not illustrated). The resistive element 24 is provided between the second terminal of the semiconductor switch 9 and the output terminal 26. An output of the signal generator 10 is connected to the gate terminal of the semiconductor switch 9.

The control DC power supply 8 receives a voltage instruction signal 28 from the measurement device 5 and outputs an instruction voltage Vc set in the voltage instruction signal 28 to the high-voltage DC power supply 7. The instruction voltage Vc is a voltage input to the input port of the high-voltage DC power supply 7 so as to control a value of voltage output from the high-voltage DC power supply 7.

The high-voltage DC power supply 7 outputs, as a high voltage Va, a voltage obtained by multiplying the instruction voltage Vc output from the control DC power supply 8 by a set factor A.

A period setting signal is set in the signal generator 10. One period of the period setting signal includes a pulse supply period and a pulse pause period following the pulse supply period. The signal generator 10 receives a square wave instruction signal 29 from the measurement device 5 and generates a pulse signal representing a predetermined pulse width and a predetermined pulse repetition frequency set in the square wave instruction signal 29. The signal generator 10 superimposes the period setting signal and pulse signal on each other to generate a rectangular waveform signal 34 in which a predetermined number of pulse signals set in the square wave instruction signal 29 are generated only in the pulse supply period of the period setting signal. Details of the period setting signal, pulse signal, and rectangular waveform signal 34 will be described later.

The semiconductor switch 9 is turned ON when a voltage value to be supplied to the gate electrode is equal to or higher than a preset voltage threshold to connect the first and second terminals. More specifically, the semiconductor switch 9 charges the capacitor 6 with the high voltage Va from the high-voltage DC power supply 7 when a voltage value of the rectangular waveform signal 34 is lower than the voltage threshold; while it applies an impulse voltage Vain having a peak value equal to a value of the high voltage Va from the capacitor 6 to the electric motor 2 when the voltage value of the rectangular waveform signal 34 is equal to or higher than the voltage threshold.

The voltage detector 18 detects the impulse voltage Vain to be applied to the electric motor 2 (section between phases of the winding of the electric motor 2, in the above example) provided between the output terminals 26 and 27 and outputs an application voltage signal 37 representing the impulse voltage Vain to the measurement device 5.

The partial discharge detector 4 detects the partial discharge generated in the electric motor 2 to which the impulse voltage Vain is applied, and outputs a detection signal 36 based on the partial discharge to the measurement device 5. For example, as the partial discharge detector 4, there may be adopted any configurations that detect a physical quantity generated with the partial discharge, such as one detecting a current flowing in the winding of the electric motor 2 by a CT (Current Transformer) and one detecting an electromagnetic wave around the winding of the electric motor 2 by an antenna.

The measurement device 5 is realized by a personal computer in which, for example, Windows® is installed as an OS (Operating System). The measurement device 5 includes various application programs to be described later running thereon and is provided with an interface for inputting/outputting a signal from/to an external device. With this configuration, the measurement device 5 can perform a function as an oscilloscope that displays an input signal on a screen as a waveform or a function for controlling measurement of the partial discharge.

The measurement device 5 includes a voltage instruction section 11, an application voltage signal observation circuit 12, a voltage value acquiring section 13, a detection signal observation circuit 14, a partial discharge frequency calculation section 15, a signal instruction section 16, and a controller 17.

The constituent elements of the measurement device 5 other than the application voltage signal observation circuit 12 and the detection signal observation circuit 14, that is, the voltage instruction section 11, the voltage value acquiring section 13, the partial discharge frequency calculation section 15, the signal instruction section 16, and the controller 17 are each constituted by hardware or software. For example, when each constituent element is constituted by software, it can be realized by a computer program.

The voltage instruction section 11 controls operation of the control DC power supply 8 through a communication interface for performing communication such as RS-232C so as to apply the impulse voltage Vain having the same voltage level to the electric motor 2. More specifically, for controlling the control DC power supply 8, the controller 17 generates the voltage instruction signal 28 in which an initial voltage is set as the instruction voltage Vc in a first period (corresponding to a first period of the rectangular waveform signal 34) of the period setting signal, and the voltage instruction section 11 outputs the voltage instruction signal 28 to the control DC power supply 8. Further, in second and subsequent periods, the controller 17 sets, in the voltage instruction signal 28, a voltage obtained by adding a predetermined increment voltage that is lower than the initial voltage to the instruction voltage Vc in the immediately previous period as a new instruction voltage Vc, and the voltage instruction section 11 outputs the voltage instruction signal 28 to the control DC power supply 8.

The signal instruction section 16 controls operation of the signal generator 10 through a communication interface for performing communication such as RS-232C so as to apply a predetermined number of the impulse voltages Vain having a predetermined pulse width and a predetermined repetition frequency to the electric motor 2. More specifically, for controlling the signal generator 10, the controller 17 generates the square wave instruction signal 29 in which a predetermined pulse width, a predetermined pulse repetition frequency, and a predetermined number are set, and the signal instruction section 16 outputs the square wave instruction signal 29 to the signal generator 10.

The application voltage signal observation circuit 12 observes the application voltage signal 37 output from the voltage detector 18. The application voltage signal 37 is transferred to the voltage value acquiring section 13.

The voltage value acquiring section 13 acquires a value (peak value) of the voltage applied to the electric motor 2 based on the transferred application voltage signal 37. More specifically, the voltage value acquiring section 13 receives the application voltage signal 37 from the application voltage signal observation circuit 12 in a period in which the partial discharge frequency first reaches a specified frequency or more and acquires a peak value (value of the high voltage Va) of the voltage represented by the application voltage signal 37, and the controller 17 sets the voltage peak value as a partial discharge staring voltage.

The detection signal observation circuit 14 observes the detection signal 36 output from the partial discharge detector 4. The detection signal 36 is then transferred to the partial discharge frequency calculation section 15.

The partial discharge frequency calculation section 15 inputs thereto the detection signal 36 observed by the detection signal observation circuit 14, and counts, on a per period basis, an input frequency of the detection signal 36 as a frequency of occurrence of the partial discharge (partial discharge frequency). More specifically, the partial discharge frequency calculation section 15 applies, e.g., digital filtering to the detection signal 36 observed by the detection signal observation circuit 14 to remove unnecessary signal component, thereby extracting only a signal (partial discharge signal) representing the partial discharge. After that, the partial discharge frequency calculation section 15 evaluates an absolute value of the peak value of the partial discharge signal using a predetermined discharge determination threshold, and counts, on a per period basis, the partial discharge frequency based on the evaluation result. In this manner, the partial discharge frequency calculation section 15 counts the number of times that the partial discharge signal is extracted on a per period basis as the partial discharge frequency.

As described above, according to the partial discharge measurement system 1, a predetermined number of impulse voltages Vain having the same peak value, a predetermined pulse width, and a predetermined repetition frequency are applied to the electric motor 2, and the frequency of occurrence of the partial discharge is counted every time the predetermined number of impulse voltages are applied. After that, the controller 17 raises stepwise the peak value of the impulse voltage Vain through the voltage instruction section 11. Then, when the partial discharge frequency calculation section 15 counts the occurrence of the partial discharge by a specified frequency, the controller 17 regards the voltage at that time as the partial discharge starting voltage.

Figure 2A:
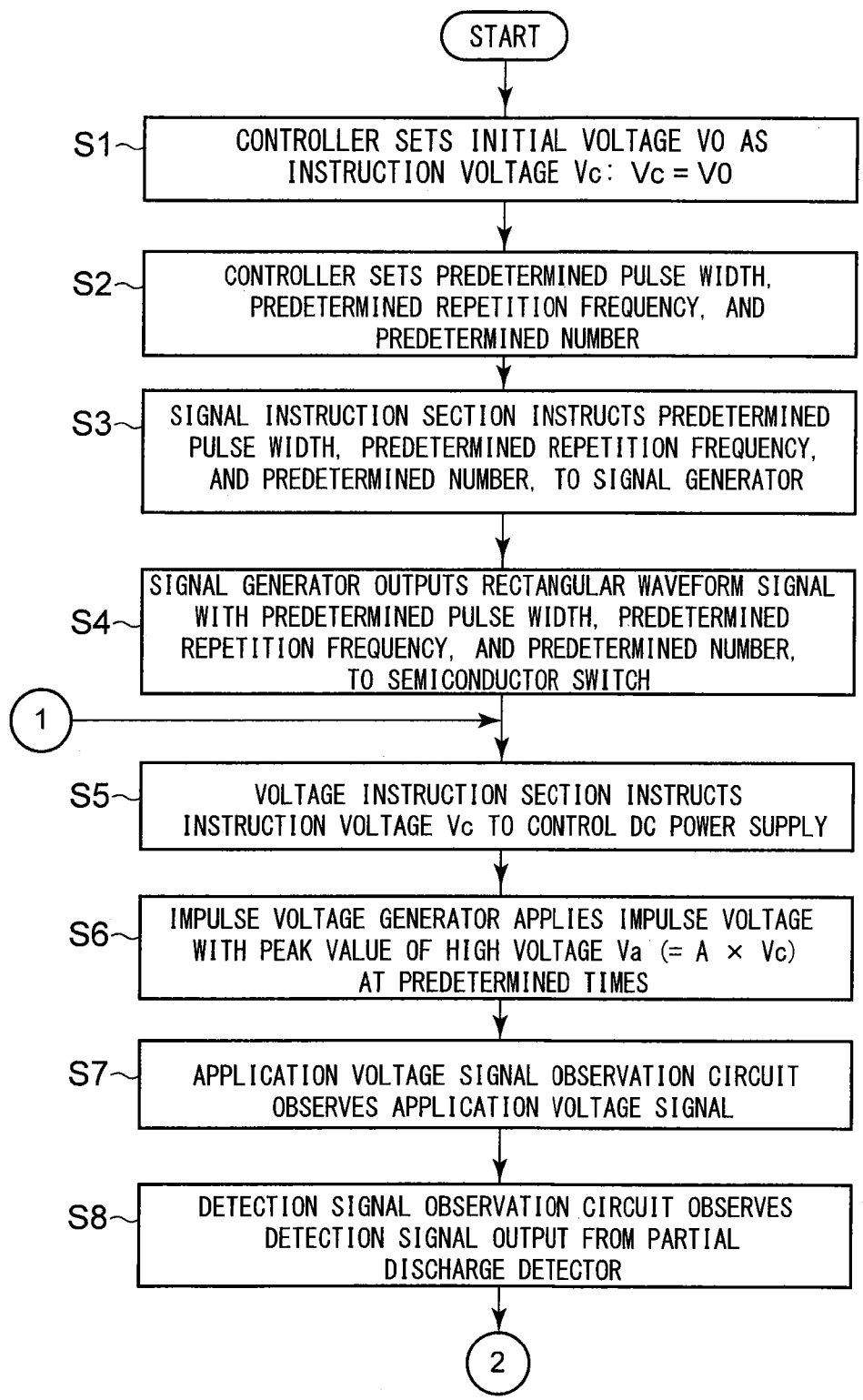
FIG. 2A is a flowchart illustrating a measurement procedure of a partial discharge starting voltage Vpdiv.
Figure 2B:
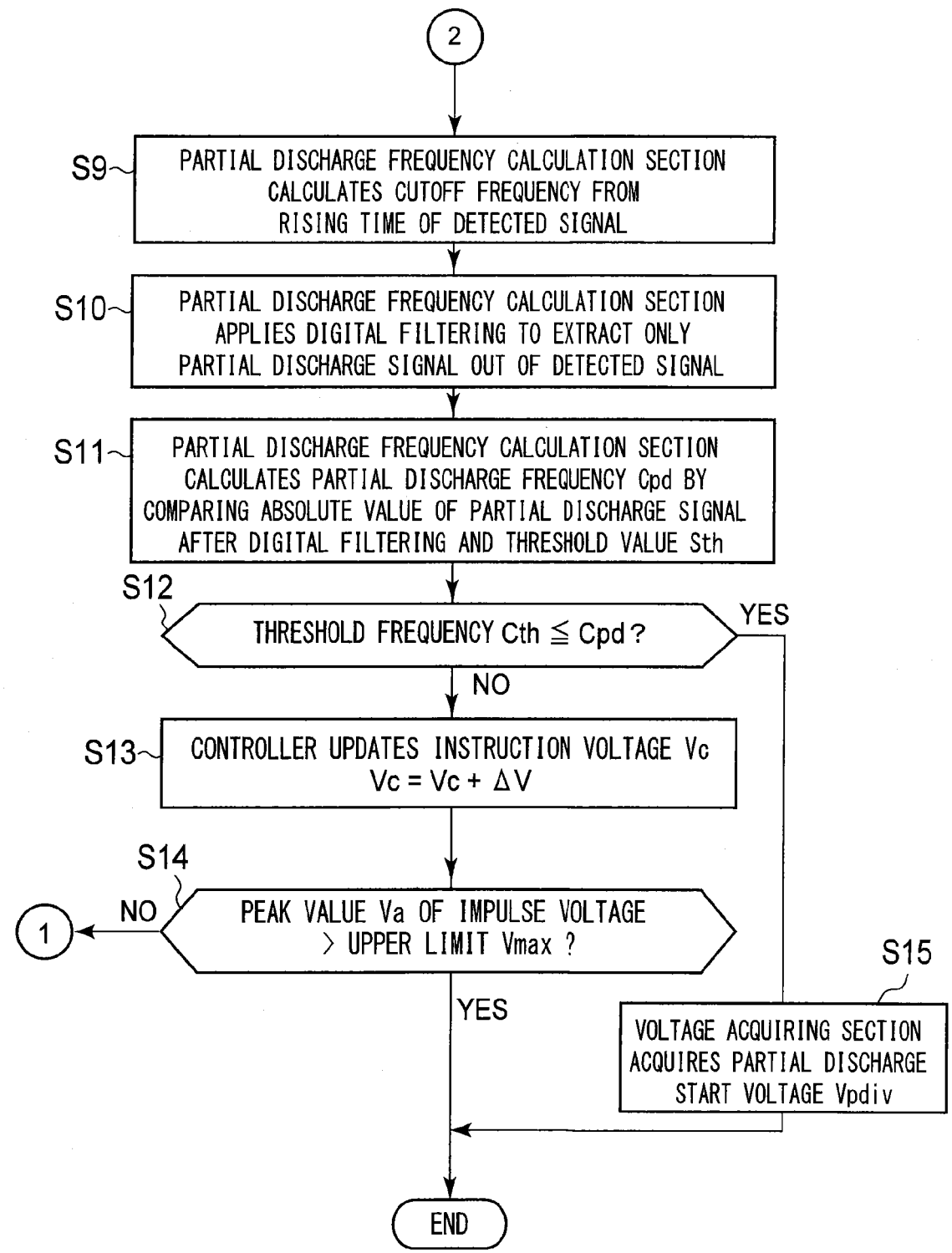
FIG. 2B is a flowchart illustrating the measurement procedure of the partial discharge starting voltage Vpdiv.
Figure 3A:
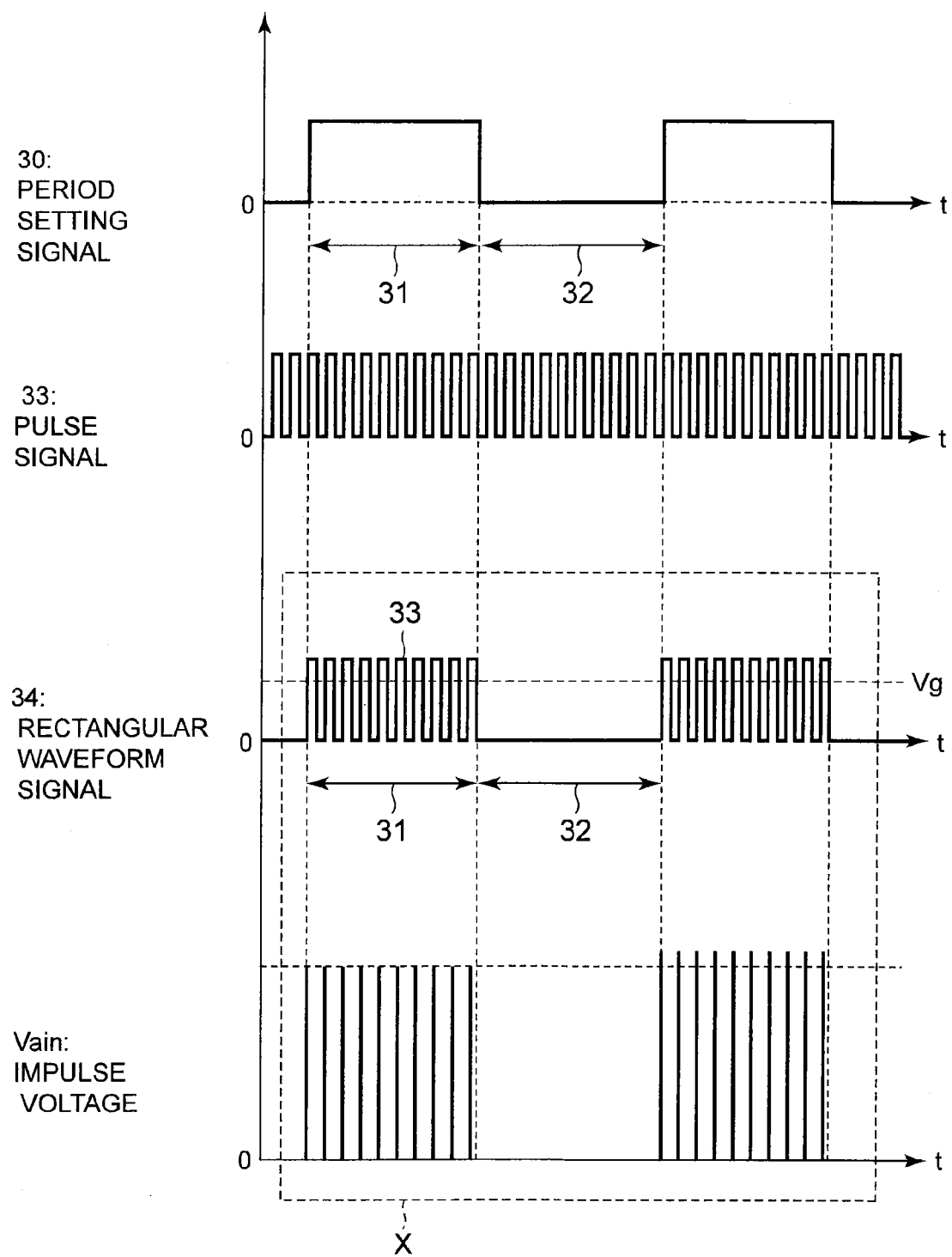
FIG. 3A is a timing chart illustrating a period setting signal 30, a pulse signal 33, and a rectangular waveform signal 34 which are generated by a signal generator, and an impulse voltage Vain generated by a semiconductor switch.
Figure 3B:
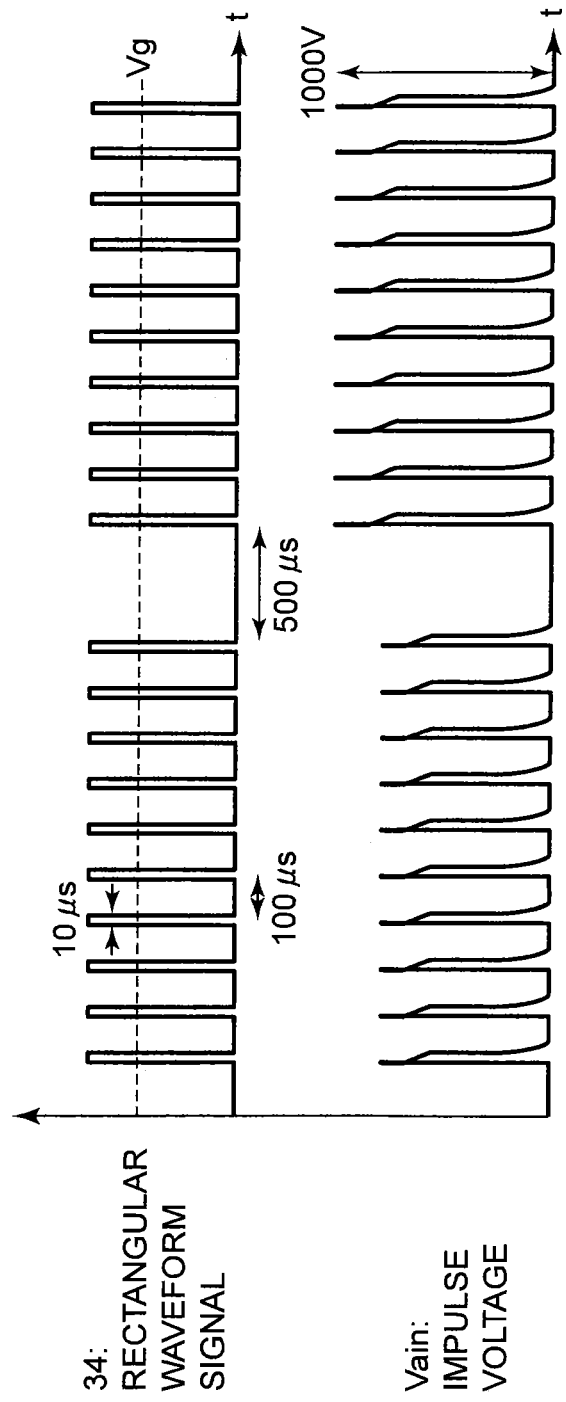
FIG. 3B is an enlarged view of a part X of FIG. 3A.

FIGS. 2A and 2B are each a flowchart illustrating a measurement procedure of a partial discharge starting voltage Vpdiv. FIG. 3A is a timing chart illustrating a period setting signal 30, a pulse signal 33, and a rectangular waveform signal 34 which are generated by the signal generator 10 and impulse voltage Vain generated by the semiconductor switch 9. FIG. 3B is an enlarged view of a part X of FIG. 3A.

The controller 17 initializes the instruction voltage Vc for indicating the peak value of the impulse voltage generator 3 to an initial voltage V0. More specifically, in a first period (corresponding to a first period of the rectangular waveform signal 34) of the period setting signal, the controller 17 generates the voltage instruction signal 28 in which the initial voltage is set as the instruction voltage Vc (step S1).

Then, the controller 17 generates the square wave instruction signal 29 in which a predetermined pulse width (e.g., 10 µs), a predetermined repetition frequency (e.g., 10 kHz), and a predetermined number (e.g., 10) which are parameters of the impulse voltage Vain output from the impulse voltage generator 3 (step S2). The signal instruction section 16 outputs the square wave instruction signal 29 to the signal generator 10 (step S3). The signal generator 10 outputs the rectangular waveform signal 34 having the predetermined pulse width, predetermined repetition frequency, and predetermined number set in the square wave instruction signal 29 (step S4).

The above-mentioned step S4 will be described more specifically.

The period setting signal 30 as illustrated in FIG. 3A is set in the signal generator 10. One period of the period setting signal 30 includes a pulse supply period 31 and a pulse pause period 32 following the pulse supply period 31. The signal generator 10 receives the square wave instruction signal 29 from the measurement device 5, and generates the pulse signal 33 as illustrated in FIG. 3A. The pulse signal 33 represents the predetermined pulse width and predetermined pulse repetition frequency which are set in the square wave instruction signal 29. The pulse repetition frequency is higher than a frequency of the period setting signal 30. The signal generator 10 superimposes the period setting signal 30 and the pulse signal 33 on each other to generate the rectangular waveform signal 34 as illustrated in FIG. 3A. In the rectangular waveform signal 34, a predetermined number of pulse signals 33 set in the square wave instruction signal 29 are generated in only the pulse supply period 31.

Then, the voltage instruction section 11 outputs the voltage instruction signal 28, in which the instruction voltage Vc is set, to the control DC power supply 8 (step S5). At this time, the high-voltage DC power supply 7 outputs the high voltage Va which is a voltage obtained by multiplying the instruction voltage Vc set in the voltage instruction signal 28 by a set factor A (A is e.g., 3000). As a result, the capacitor 6 is charged with the high voltage Va. The semiconductor switch 9 repeats ON and OFF based on the rectangular waveform signal 34 output from the signal generator 10 and, thereby, the impulse voltage Vain is generated from the charged voltage of the capacitor 6 and is then applied to the electric motor 2 (step S6).

The above-mentioned step S6 will be described more specifically.

The semiconductor switch 9 is turned OFF when the voltage value of the rectangular waveform signal 34 is lower than a voltage threshold Vg and charges the capacitor 6 with the high voltage Va from the high-voltage DC power supply 7. On the other hand, the semiconductor switch 9 is turned ON when the voltage value of the rectangular waveform signal 34 is equal to or higher than the voltage threshold Vg and applies the impulse voltage Vain as illustrated in FIG. 3A from the capacitor 6 to the electric motor 2. As illustrated in FIG. 3B, the impulse voltage Vain has a peak value equal to the value of the high voltage Va, and the rising time thereof is very short.

Then, the application voltage signal observation circuit 12 observes the application voltage signal 37 output from the voltage detector 18 (step S7). Then, the detection signal observation circuit 14 observes the detection signal 36 output from the partial discharge detector 4 (step S8).

FIG. 4 is a timing chart illustrating waveforms of the application voltage signal 37, the detection signal 36, and the partial discharge signal 38 obtained by applying the digital filtering to the detection signal 36. The partial discharge is generated when a high voltage is applied to a contact portion of enamel wires constituting the winding of the electric motor 2 and, therefore, it is often generated especially in the vicinity of the peak of the impulse voltage Vain (application voltage signal 37). When the impulse voltage Vain is applied, current flows in the winding of the electric motor 2, and a winding current signal is superimposed on the detection signal 36. When the winding current signal is superimposed on the detection signal 36, the partial discharge starting voltage cannot be measured accurately. To cope with this, an approach that extracts only the partial discharge signal by making the detection signal pass through a filter circuit is widely employed. However, frequency components of the winding current signal and partial discharge signal vary depending on measurement conditions such as a size of the electric motor 2 and a wiring length, so that the filter circuit is provided as needed.

Thus, the partial discharge frequency calculation section 15 calculates an approximate frequency band of the detection signal 36 using a generally-known relational expression between a signal rising time and a frequency band. Assuming that the rising time of the detection signal 36 transferred from the detection signal observation circuit 14 is Tri, and the frequency band thereof is Fcut, the frequency band Fcut is calculated by Fcut=0.35/Tri. In the present embodiment, a frequency ten times the frequency band Fcut is calculated as a cutoff frequency of the digital filtering (step S9).

A definition of the cutoff frequency will be described more specifically.

Assuming that the rising time Tri of the detection signal 36 is about 290 ns, the frequency band Fcut is about 1.2 MHz. The partial discharge signal has a frequency band at least one digit higher than the frequency band Fcut. Thus, in the present embodiment, 10 MHz which is a frequency ten times the frequency band Fcut (1.2 MHz) is defined as the cutoff frequency.

The partial discharge frequency calculation section 15 applies the digital filtering to the detection signal 36 based on the cutoff frequency (step S10).

In the digital filtering, data obtained by multiplying a plurality of consecutive data in a signal data string by filter coefficients calculated based on the cutoff frequency, respectively, are added to each other to thereby calculate one new data. For example, assume that the data string of the detection signal 36 is set as P (0), P (1), P (2), . . . , P (n–1), the number of consecutive data in the data string of the detection signal 36 is set to three, the three consecutive data is set as P (j−1), P (j), and P (j+1), and data string of the filter coefficient is set as F (0), F (1), F (2), F (n−1). In this case, the new data D(j) is calculated by D(j)={{P (j−1)×F (j−1)}+{P (j)×F (j)}+{P (j+1)×F (j+1)}} (where, j is 1, . . . , n−3).

The partial discharge signal 38 illustrated in FIG. 4 is obtained by applying the digital filtering to the detection signal 38 based on the cutoff frequency 10 MHz. As illustrated in FIG. 4, the detection signal 36 (in this case, the partial discharge signal 38) after digital filtering is a signal from which the winding current signal, which is an unnecessary signal component, has been removed and has only a signal component caused in response to generation of the partial discharge.

The partial discharge frequency calculation section 15 counts the occurrence frequency of the partial discharge based on the partial discharge signal 38 after digital filtering as follows. The partial discharge frequency calculation section 15 compares an absolute value of the peak value of the partial discharge signal 38 after digital filtering and a discharge determination threshold Sth (step S11). The partial discharge signal 38 after digital filtering often exhibits an attenuation vibration waveform of a high frequency. Thus, which one of a positive side peak vale and a negative side peak value becomes larger in the partial discharge signal 38 after digital filtering cannot be determined. Therefore, even when such a partial discharge signal 38 and discharge determination threshold Sth which is a fixed value are compared, it is difficult to accurately determine occurrence of the partial discharge. Thus, the partial discharge frequency calculation section 15 compares the absolute value of the partial discharge signal 38 after digital filtering and discharge determination threshold Sth. When the partial discharge signal 38 exceeds the discharge determination threshold Sth as a result of the comparison, the partial discharge frequency calculation section 15 determines that a partial discharge has occurred. In this manner, the partial discharge frequency calculation section 15 counts a partial discharge frequency Cpd which is the occurrence frequency of the partial discharge.

Then, the controller 17 compares the partial discharge frequency Cpd transferred from the partial discharge frequency calculation section 15 and a specified frequency Cth (step S12). In the present embodiment, the specified frequency Cth is set to "5" which is ½ of the above-mentioned predetermined number "10". When the partial discharge frequency Cpd is less than the specified frequency Cth ("NO" in step S12), the controller 17 updates the instruction voltage Vc (step S13). More specifically, the controller 17 sets, in the voltage instruction signal 28, a voltage obtained by adding a predetermined increment voltage ΔV to the instruction voltage Vc in the immediately previous period as a new instruction voltage Vc. The predetermined increment voltage ΔV is set lower than the initial voltage V0, and the instruction voltage Vc is set to a voltage higher by the predetermined increment voltage ΔV (e.g., 0.03 V) than the instruction voltage Vc in the immediately previous period (Vc=Vc+ΔV).

Then, the controller 17 determines whether or not a voltage obtained by multiplying the updated instruction voltage Vc by the set factor A, i.e., high voltage Va, exceeds an upper limit value Vmax (step S14). This step S14 is provided for preventing an endless loop which may occur when, for example, the partial discharge frequency Cpd does not become equal to or more than the specified frequency Cth for some cause, such as a fault, even when the high voltage Va continues to be increased. Thus, the Vmax should be set to a voltage sufficiently higher than an ordinarily expected partial discharge starting voltage. When the high voltage Va exceeds the upper limit voltage Vmax ("YES" in step S14), this routine is ended. On the other hand, when the high voltage Va is equal to or lower than the upper limit voltage Vmax ("NO" in step S14), the voltage instruction section 11 outputs, in step S5, the voltage instruction signal 28 in which the instruction voltage Vc is set to the control DC power supply 8, and processing of step S6 and subsequent steps are executed once again.

On the other hand, when the partial discharge frequency Cpd is equal to or more than the specified frequency Cth ("YES" in step S12), the voltage value acquiring section 13 receives the voltage value applied to the electric motor 2, i.e., the application voltage signal 37 from the application voltage signal observation circuit 12, acquires the peak value (value of the high voltage Va) of the voltage represented by the application voltage signal 37, and transfers the peak value to the controller 17 (step S15). As described above, the voltage value acquiring section 13 acquires the peak value of the voltage from the application voltage signal 37 in the period in which the partial discharge frequency Cpd first becomes equal to or more than the specified frequency Cth. The controller 17 sets the peak value of the voltage as the partial discharge starting voltage Vpdiv and ends this routine.

According to the partial discharge measurement of the present embodiment based on the above-mentioned processing, the impulse voltage Vain is applied to the electric motor 2 according to a repeated pattern in which the peak value of the impulse voltage Vain is increased stepwise by voltage A×ΔV every time the ten impulse voltages Vain have been applied until the partial discharge frequency Cpd becomes equal to or more than the specified frequency Cth ("YES" in step S12).

Figure 5:
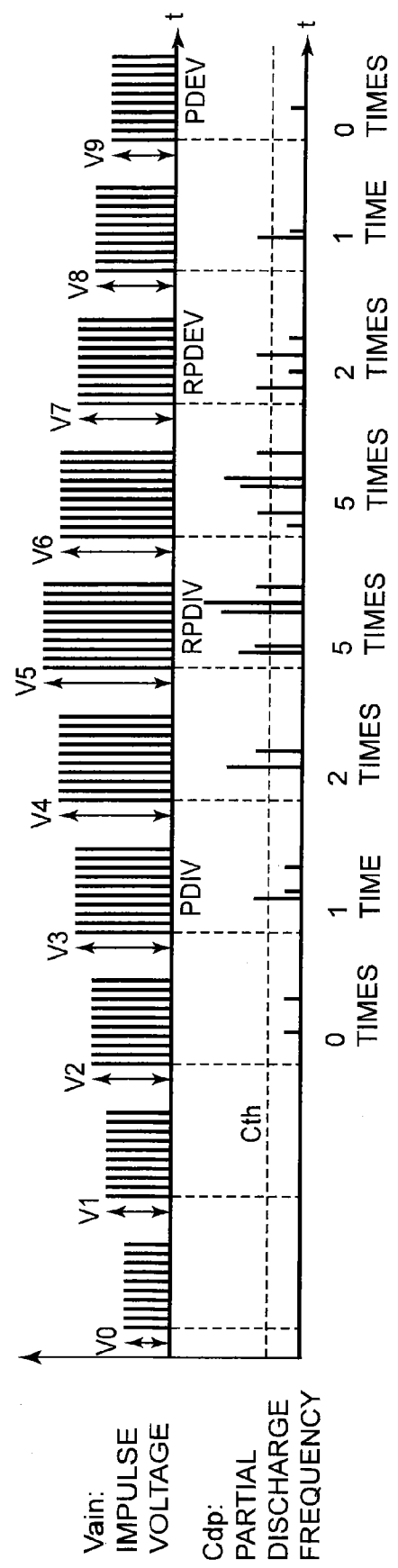
FIG. 5 is a timing chart illustrating an impulse voltage Vain and a partial discharge frequency Cpd on a per period basis.
Figure 6A:
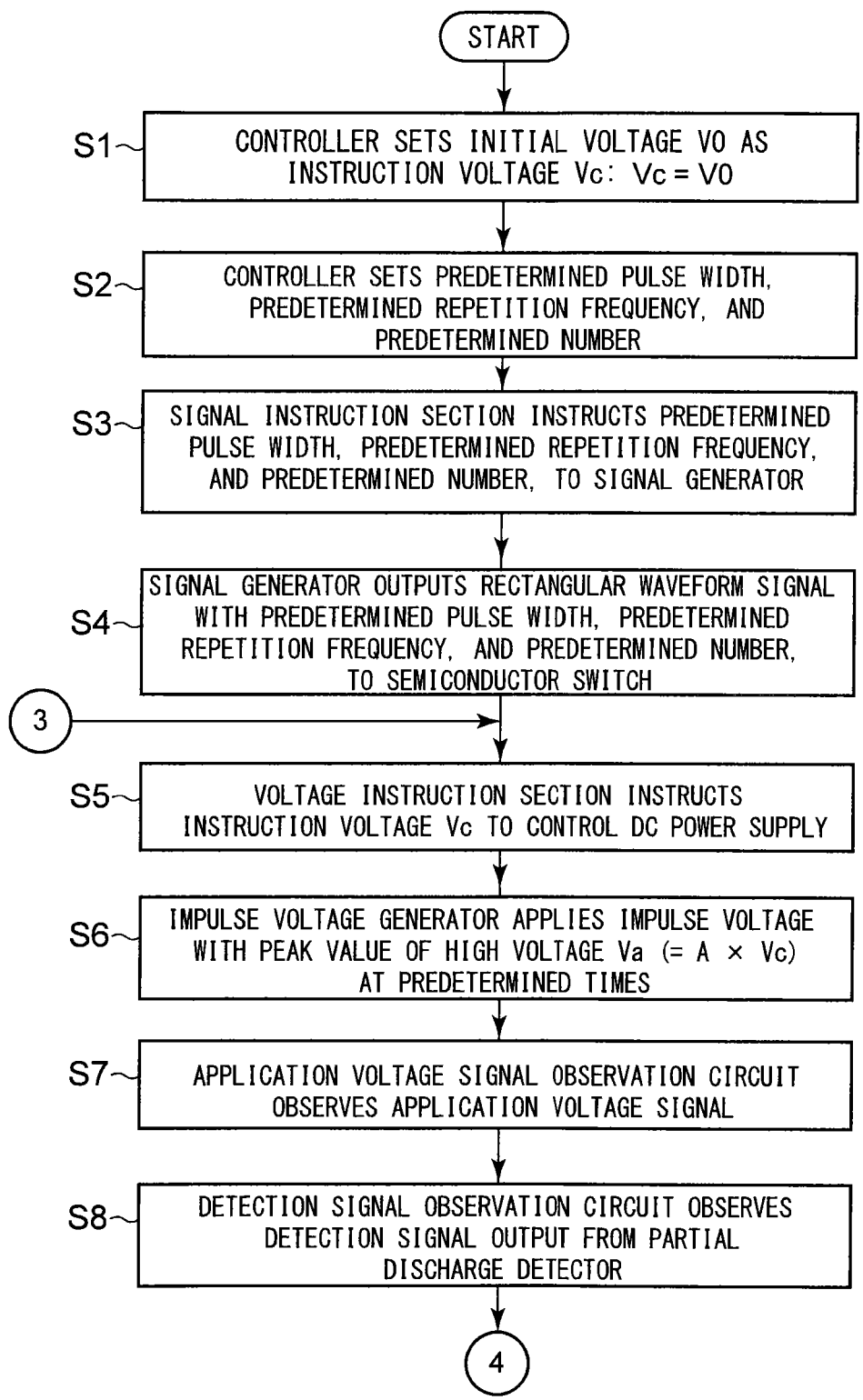
FIG. 6A is a flowchart illustrating a measurement procedure of a partial discharge starting voltage Vpdiv and a partial discharge extinction voltage Vpdev.
Figure 6B:
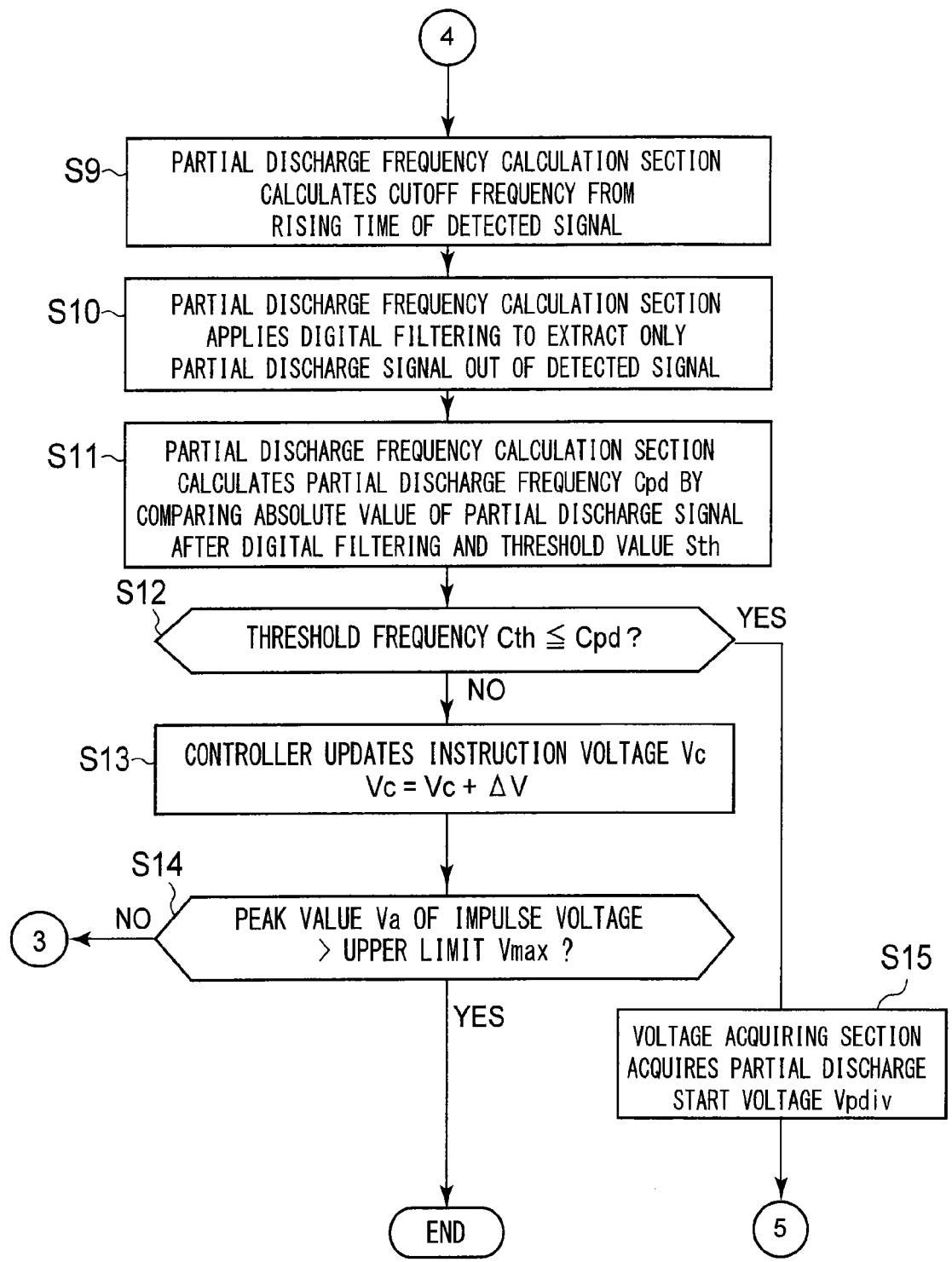
FIG. 6B is a flowchart illustrating a measurement procedure of the partial discharge starting voltage Vpdiv and the partial discharge extinction voltage Vpdev.
Figure 6C:
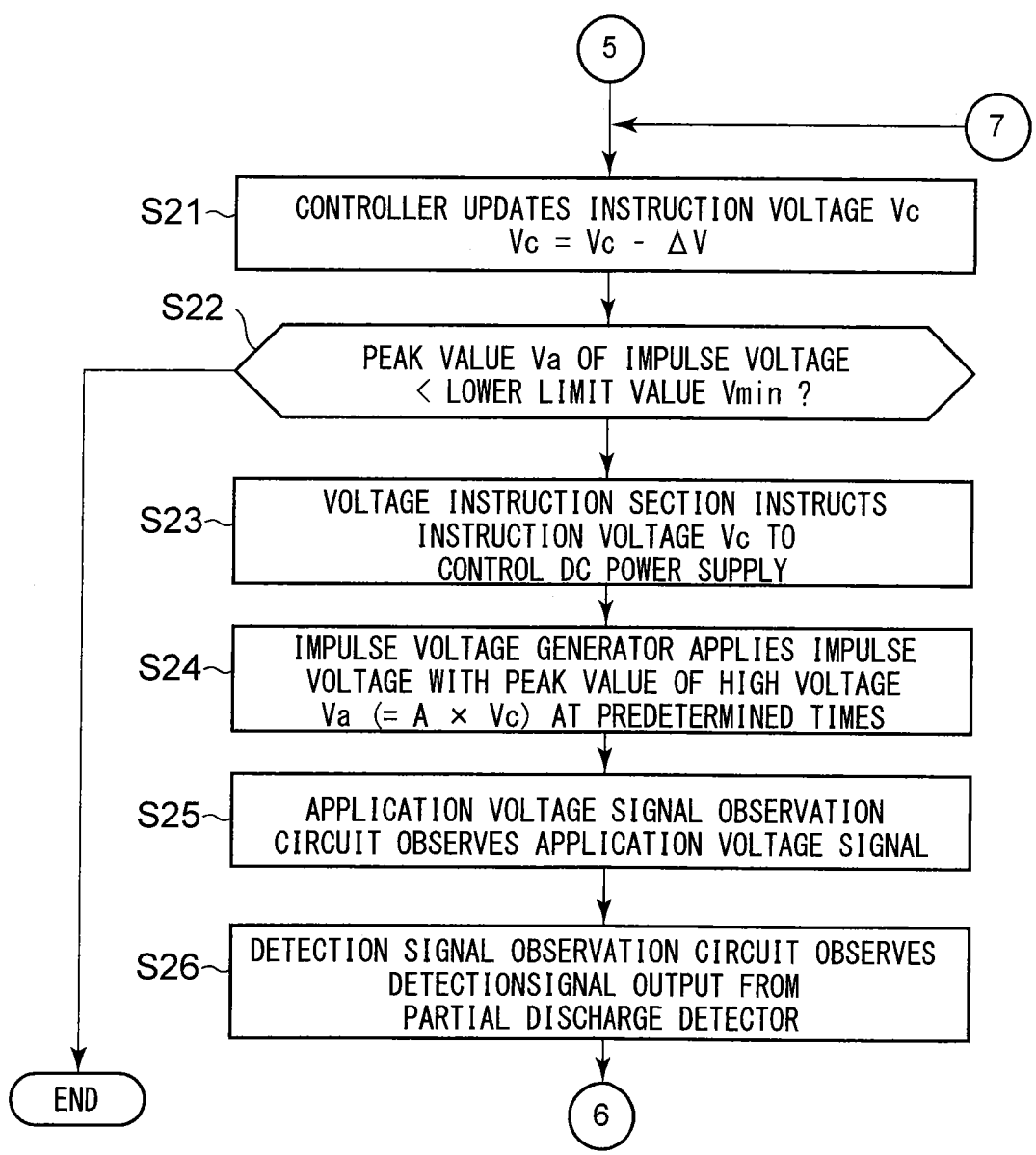
FIG. 6C is a flowchart illustrating a measurement procedure of the partial discharge starting voltage Vpdiv and the partial discharge extinction voltage Vpdev.
Figure 6D:
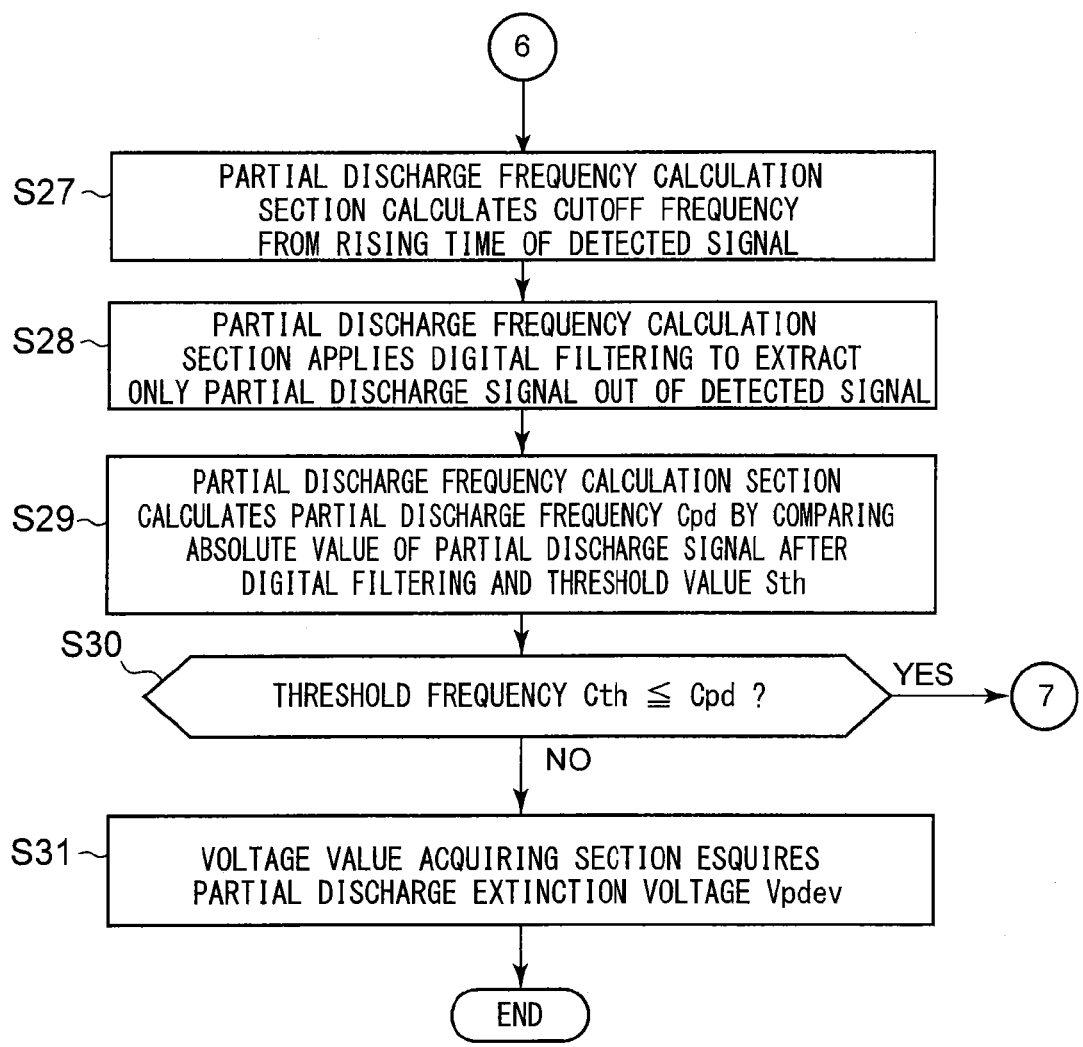
FIG. 6D is a flowchart illustrating a measurement procedure of the partial discharge starting voltage Vpdiv and the partial discharge extinction voltage Vpdev.

FIG. 5 is a timing chart illustrating the impulse voltage Vain and partial discharge frequency Cpd on a per period basis. In FIG. 5, assuming that an amplification factor (the above-mentioned factor A) by the high DC voltage is 3000, an initial value of the instruction voltage Vc is V0 (e.g., 0.4 V), and the predetermined increment voltage ΔV is, e.g., 0.03 V, a boosting range of a voltage to be applied is 90 V (=3000× 0.03 V), and the high voltage Va after m-th update is represented as Vm (=A×Vc). As illustrated in FIG. 5, in a period during which the instruction voltage Vc is V0 to V4, that is, in a period during which the impulse voltage Vain is 1200 V (3000×V0) to 1520 V (3000×V4), the partial discharge frequency Cpd is less than the specified frequency Cth. Note that in a period PDIV during which the instruction voltage is V3, the partial discharge frequency Cpd is first counted. In a period RPDIV during which the instruction voltage Vc is V5, that is, in a period during which the impulse voltage Vain is 1610 V (3000×V5), the partial discharge frequency Cpd is equal to or more than the specified frequency Cth. In this period RPDIV, it is determined that the partial discharge starting voltage Vpdiv has occurred, and the boost of the impulse voltage Vain is stopped.

After calculation of the partial discharge starting voltage Vpdiv in this manner, it is possible to measure also a partial discharge extinction voltage. In this case, the voltage instruction section 11 controls the control DC power supply 8 and signal generator 10 such that the impulse voltage Vain is applied to the electric motor 2 according to a repeated pattern in which the peak value of the impulse voltage Vain is reduced stepwise every time a predetermined number of the impulse voltages Vain having the same peak value have been applied.

FIGS. 6A to 6D are flowcharts each illustrating a measurement procedure of the partial discharge starting voltage Vpdiv and partial discharge extinction voltage Vpdev.

In the flowcharts of FIGS. 6A to 6D, the processing from step S1 to step S15 is the same as that illustrated in the flowcharts of FIGS. 2A and 2B. After step S15, the controller 17 updates the instruction voltage Vc (step S21). More specifically, the controller 17 sets, in the voltage instruction signal 28, a voltage obtained by subtracting the predetermined voltage ΔV from the instruction voltage Vc in the immediately previous period as a new instruction voltage Vc. That is, the new instruction voltage Vc is set to a voltage lower by the predetermined increment voltage (e.g., 0.03 V) than the instruction voltage Vc in the immediately previous period (Vc=Vc−ΔV).

Then, the controller 17 determines whether or not a voltage obtained by multiplying the updated instruction voltage Vc by the set factor A, i.e., high voltage Va (=A×Vc) falls below a lower limit value Vmin (step S22). This step S22 is provided for a similar reason as in step S15 of FIG. 2B. Thus, the Vmin should be set to a voltage sufficiently lower than the ordinary expected partial discharge extinction voltage. When the high voltage Va falls below the lower limit voltage Vmin ("YES" in step S22), this routine is ended. On the other hand, when the high voltage Va is equal to or higher than the lower limit voltage Vmin ("NO" in step S22), the voltage instruction section 11 outputs the voltage instruction signal 28 in which the instruction voltage Vc is set to the control DC power supply 8 (step S23). After that, processing from step S24 to step S29 which is similar to that from step S6 to step S11 illustrated in FIGS. 2A and 2B is executed.

Then, the controller 17 compares the specified frequency Cth and partial discharge frequency Cpd (step S30). When the partial discharge frequency Cpd is equal to or more than the specified frequency Cth ("YES" in step S30), the processing flow returns to step S21.

On the other hand, when the partial discharge frequency Cpd is less than the specified frequency Cth ("NO" in step S30), the voltage value acquiring section 13 receives the voltage value applied to the electric motor 2, i.e., the application voltage signal 37 from the application voltage signal observation circuit 12, acquires the peak value (value of the high voltage Va) of the voltage represented by the application voltage signal 37, and transfers the peak value to the controller 17 (step S31). As described above, the voltage value acquiring section 13 acquires the peak value of the voltage from the application voltage signal 37 in a period in which the partial discharge frequency Cpd first becomes less than the specified frequency Cth after the period RPDIV in which the partial discharge starting voltage Vpdiv is calculated. The controller 17 sets the peak value of the voltage as the partial discharge extinction voltage Vpdev and ends this routine.

As illustrated in FIG. 5, in a period RPDEV in which the instruction voltage Vc is V7, that is, the impulse voltage Vain is 1430 V (3000×V7), the partial discharge frequency Cpd is less than the specified frequency Cth. Further, in a period PDEV in which the instruction voltage Vc is V9, that is, the impulse voltage Vain is 1250 V (3000×V9), the partial discharge frequency Cpd is not counted.

As described above, the partial discharge measurement system 1 according to the present embodiment applies to the electric motor 2 a predetermined number of impulse voltages Vain having a predetermined pulse width and a predetermined repetition frequency, and calculates the partial discharge frequency Cpd, every time the impulse voltages are applied. A user can perform various partial discharge measurement works, such as measurement of the partial discharge starting voltage Vpdiv and the partial discharge extinction voltage Vpdev by using the partial discharge frequency Cpd and the like acquired by the partial discharge measurement system 1. As described above, according to the partial discharge measurement system 1 of the present embodiment, it is possible to reduce works that the user performs such a work (e.g., reading of a meter or displayed numerical values) that may affect measurement accuracy. As a result, highly accurate partial discharge measurement can be performed.

In the measurement of the partial discharge starting voltage Vpdiv, boost of the impulse voltage Vain is stopped when it is determined that the partial discharge frequency Cpd is equal to or more than the specified frequency Cth. Further, in the measurement of the partial discharge extinction voltage Vpdev, the application of the impulse voltage Vain is stopped when it is determined that the partial discharge frequency Cpd is less than the specified frequency Cth. With the above configuration, a time required for the partial discharge measurement can be reduced. Further, application of an excessive voltage to the winding of the electric motor 2 to be measured can be suppressed to thereby prevent the object to be measured from suffering damage due to overloading.

The measurement device 5 observes the application voltage signal 37 or detection signal 36 every time a predetermined number of the impulse voltages Vain having the same peak value is applied. The impulse voltage generator 3 can change the pulse width, repetition frequency, and the number of the impulse voltages Vain to be applied, thereby reducing the amount of memory necessary for observing the application voltage signal 37 or detection signal 36, which can in turn reduce a time required for the partial discharge frequency calculation section 15 to perform data processing.

The partial discharge frequency calculation section 15 calculates a frequency band of the winding current signal included in the detection signal 36 from the rising time Tri of the detection signal 36 observed by the detection signal observation circuit 14 and applies digital filtering to the detection signal using the calculated frequency as the cutoff frequency to remove the winding current signal included in the detection signal 36 and then counts the occurrence frequency of the partial discharge. This can enhance measurement accuracy of the partial discharge starting voltage Vpdiv. Further, even when parameters that contribute to the frequency of the detection signal 36, such as a load and a wiring length, are changed, it is unnecessary to use a new filter.

In the present embodiment, the cutoff frequency used in the digital filtering is calculated every time the detection signal 36 is measured; however, it is no longer necessary to newly calculate the cutoff frequency after it is once determined. Alternatively, the cutoff frequency may be calculated from the rising time of the detection signal 36 that is measured before measurement of the partial discharge starting voltage Vpdiv or the cutoff frequency may be determined from a frequency spectrum result obtained through Fourier transform processing.

Further, in the present embodiment, the parameters, such as the initial voltage V0, predetermined pulse width, predetermined repetition frequency, and predetermined number, which are set in the above-mentioned steps S1 and S2 may be input by the user on a screen of the measurement device 5.

Further, in the present embodiment, the above-mentioned step S9 may be replaced by the following processing. The partial discharge frequency calculation section 15 receives the application voltage signal 37 observed by the application voltage signal observation circuit 12, calculates the frequency band Fcut according to Fcut=0.35/Tri wherein Tri is the rising time of the application voltage signal 37, and sets the obtained Fcut as the cutoff frequency for use in the digital filtering. A flow of a signal from the application voltage signal observation circuit 12 to partial discharge frequency calculation section 15 at this time is denoted by a dashed line of FIG. 1.

For example, in FIG. 4, the rising time (300 ns) of the application voltage signal 37 and rising time (290 ns) of the detection signal 36 are nearly equal to each other. Therefore, the frequency band Fcut becomes about 1.2 MHz irrespective of whether the frequency band Fcut is calculated from the rising time (about 290 ns) of the detection signal 36 or rising time of the application voltage signal 37. The partial discharge signal has a frequency band of at least one digit higher than the frequency band Fcut, so that 10 MHz which is a frequency ten times the frequency band Fcut (1.2 MHz) can be defined as the cutoff frequency.

Further, in the present embodiment, the above-mentioned steps S9 and S10 may be replaced by the following processing. That is, the partial discharge frequency calculation section 15 may apply digital differential processing to the detection signal 36 transferred from the detection signal observation circuit 14.

In the digital differential processing, one new data by calculating a difference between first and second data constituting a signal data string is obtained. For example, assuming that the data string of the detection signal 36 is set as P (0), P (1), P (2), ..., P (n−1), the new data string is set as D (0), D (1), D (2), ..., D (n−1), and a sampling frequency is set as Ts, the new data D (k) is calculated by D (k)={{P (k)−P (k−1)}/Ts (where, k is 1, ... n−1). The division by Ts need not be performed. Further, to improve accuracy, the data D (k) may be calculated by D (k)={{P (k+1)−P (k−1)}/2 Ts (where, k is 1, ... n−2).

Figure 7:
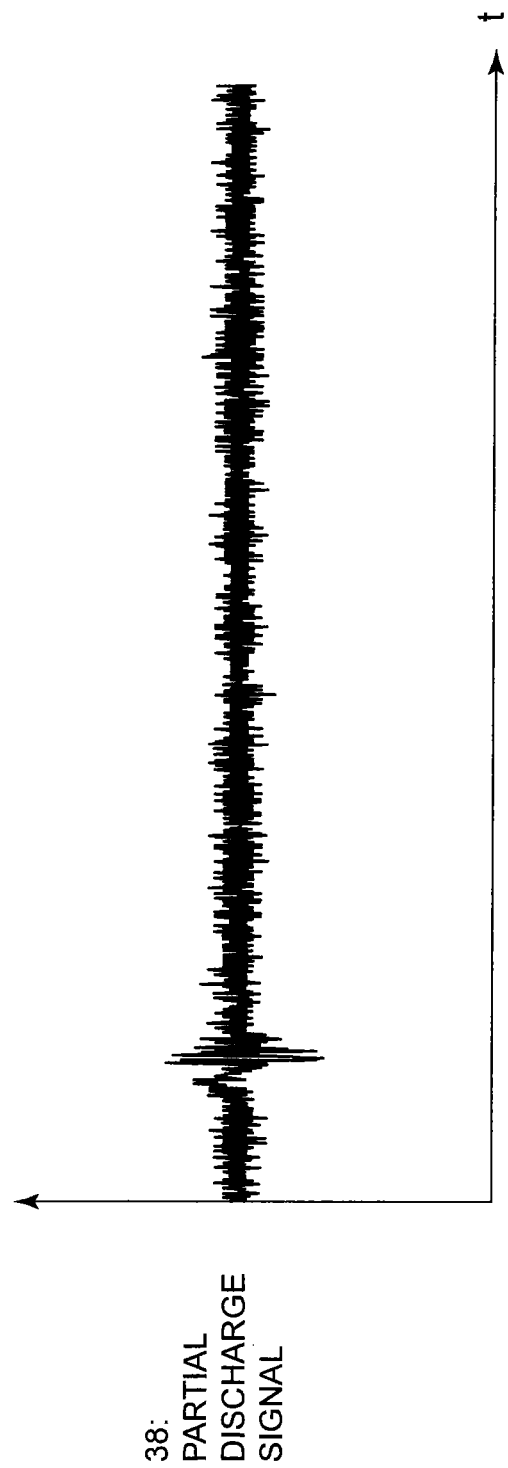
FIG. 7 is a timing chart illustrating a waveform of a partial discharge signal 38 obtained by applying digital differential processing to a detection signal 36 of FIG. 4.

FIG. 7 is a timing chart illustrating a waveform of the partial discharge signal 38 obtained by applying the digital differential processing to the detection signal 36 of FIG. 4. A change of the partial discharge signal 38 is steeper than a change of the winding current signal. Thus, in the present embodiment, by performing the digital differential processing, a signal waveform similar to a signal waveform that has been subjected to the digital filtering can be obtained at a partial discharge generation portion, thereby allowing detection of the partial discharge. As described above, the partial discharge frequency calculation section 15 can count the occurrence frequency of the partial discharge after applying the digital differential processing to the detection signal 36.

(Second Embodiment)

A partial discharge measurement system according to a second embodiment will be described focusing on only differences from the first embodiment. Parts that are not particularly described are the same as those in the first embodiment.

Figure 8:
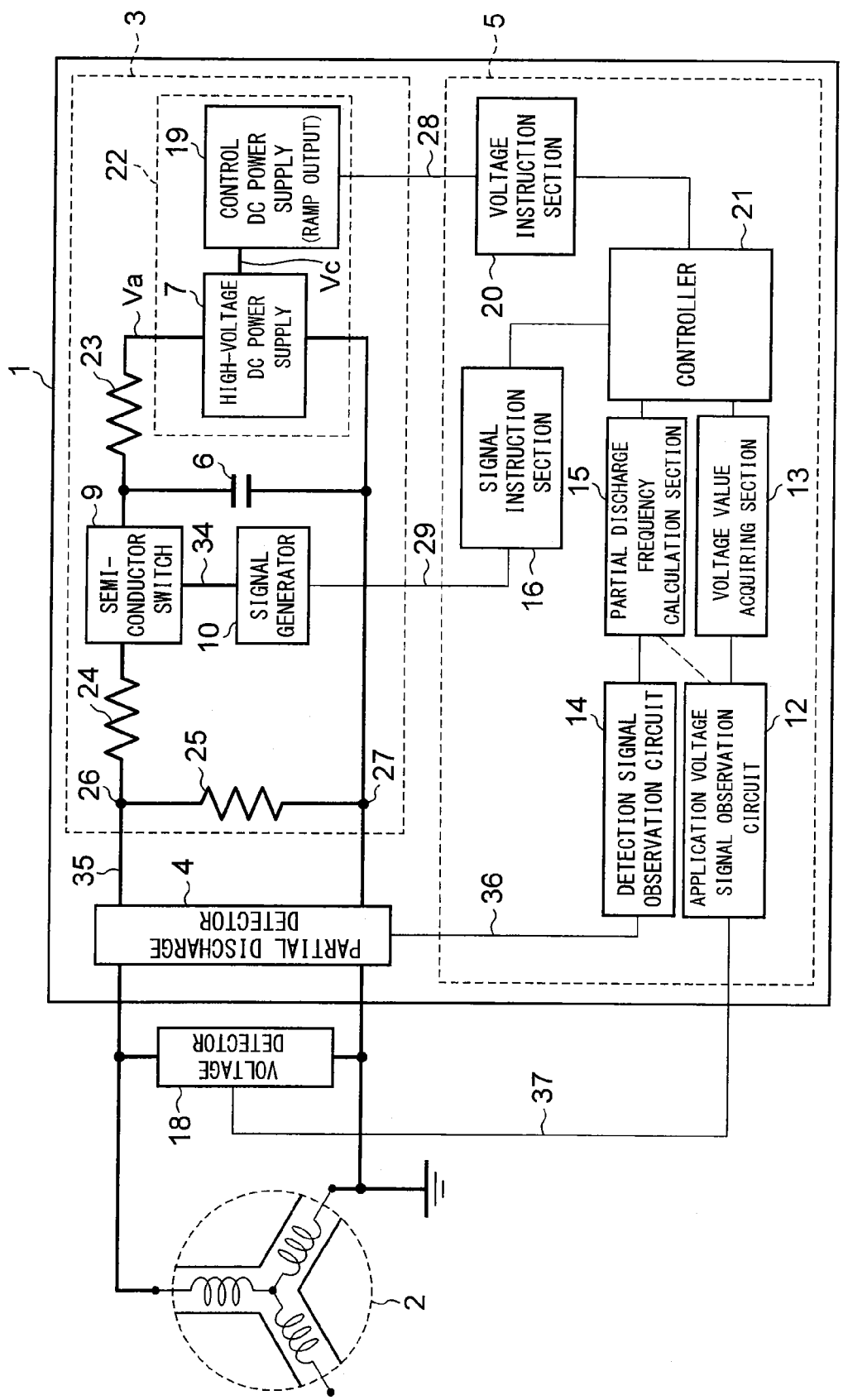
FIG. 8 is a block diagram illustrating a schematic configuration of a partial discharge measurement system according to a second embodiment.
Figure 9A:
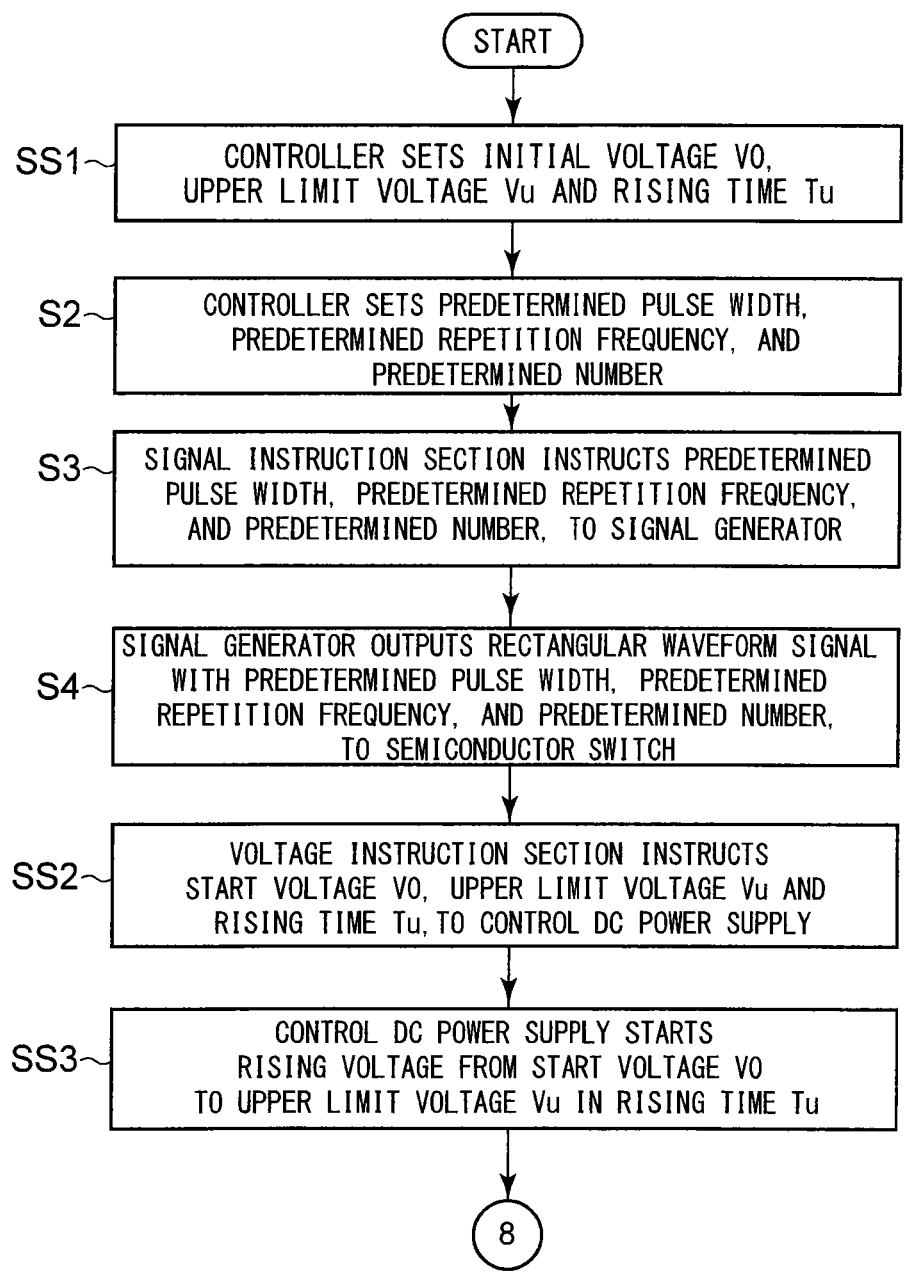
FIG. 9A is a flowchart illustrating a measurement procedure of the partial discharge starting voltage Vpdiv and the partial discharge extinction voltage Vpdev.
Figure 9B:
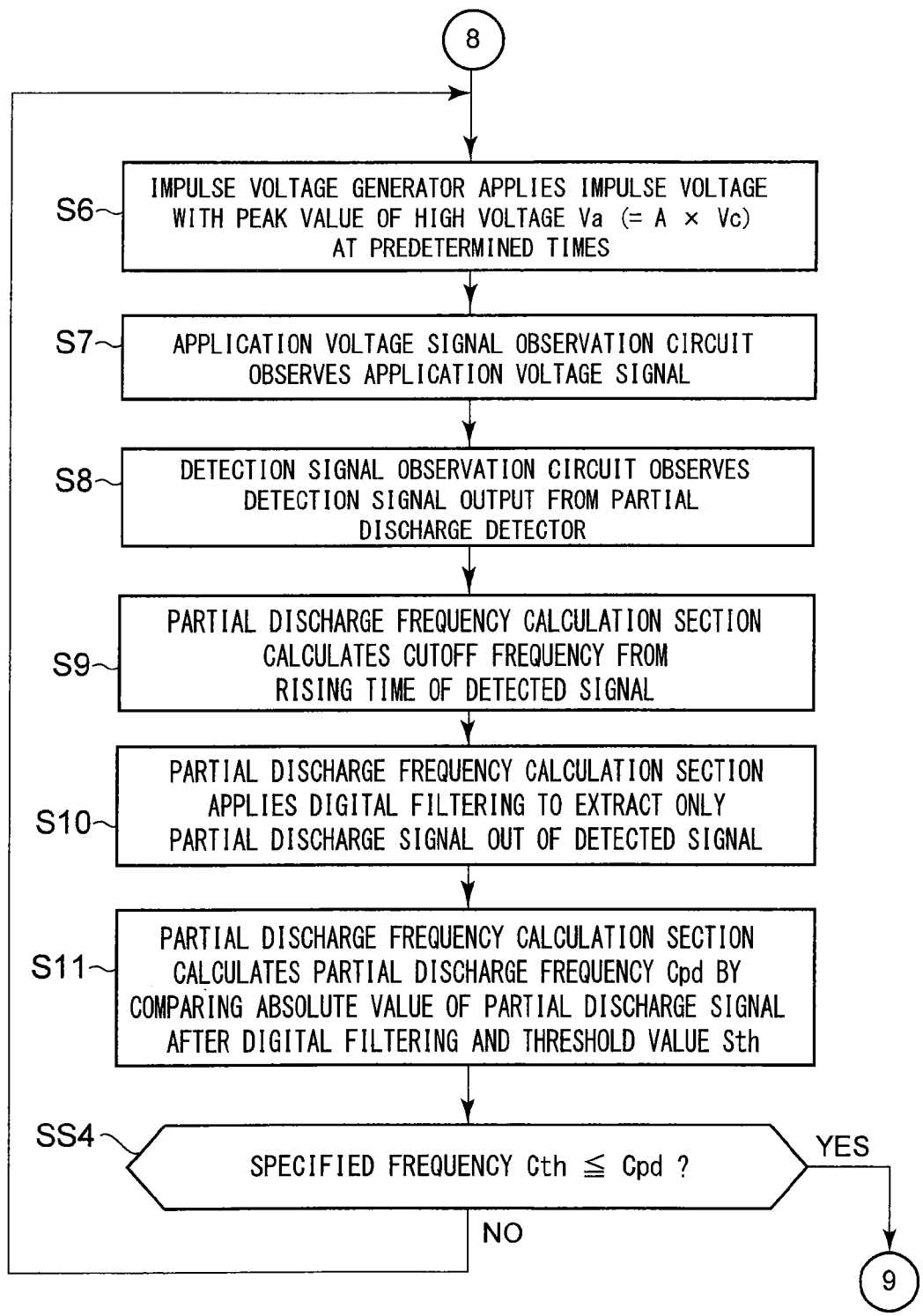
FIG. 9B is a flowchart illustrating a measurement procedure of the partial discharge starting voltage Vpdiv and the partial discharge extinction voltage Vpdev.
Figure 9C:
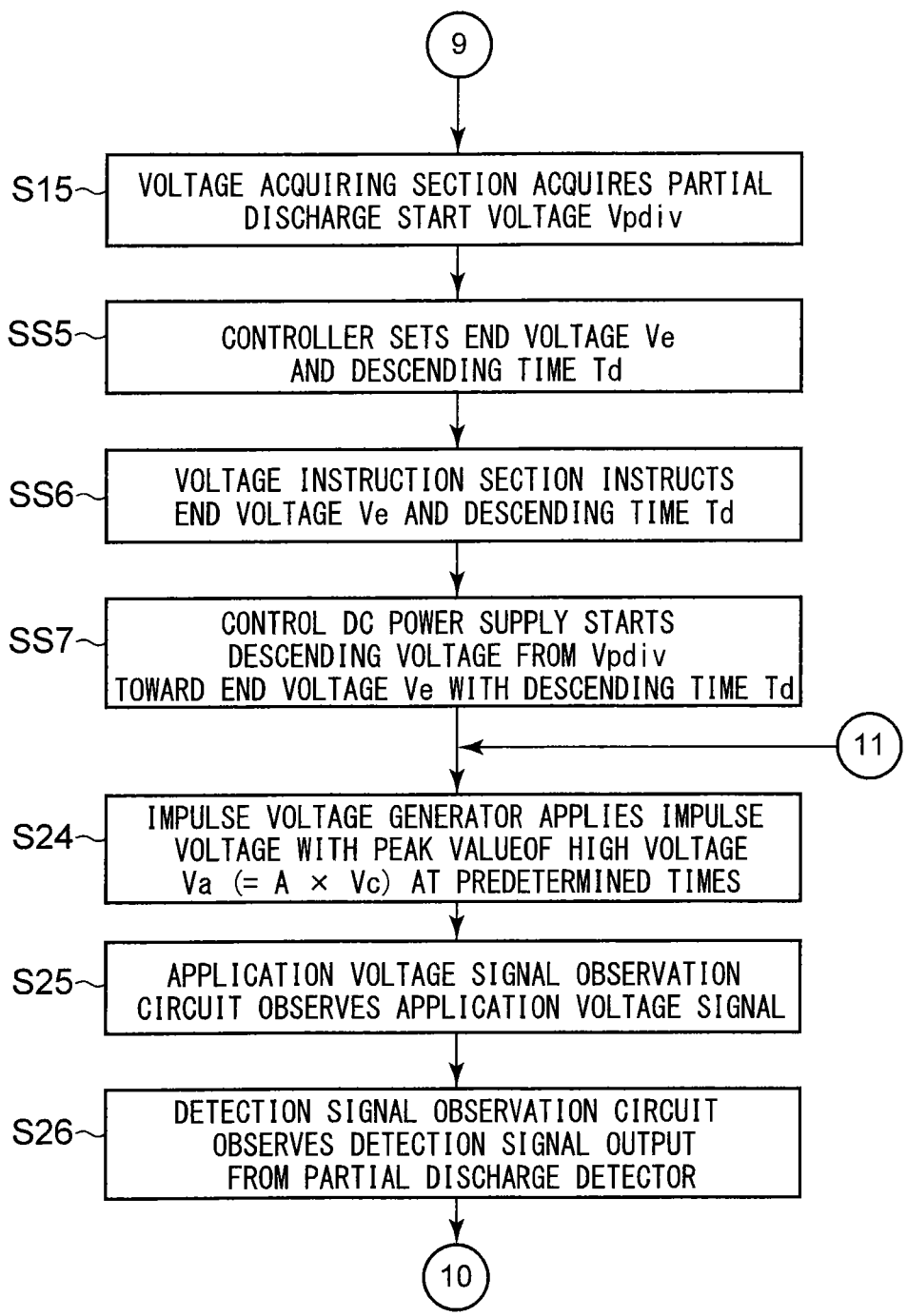
FIG. 9C is a flowchart illustrating a measurement procedure of the partial discharge starting voltage Vpdiv and the partial discharge extinction voltage Vpdev.
Figure 9D:
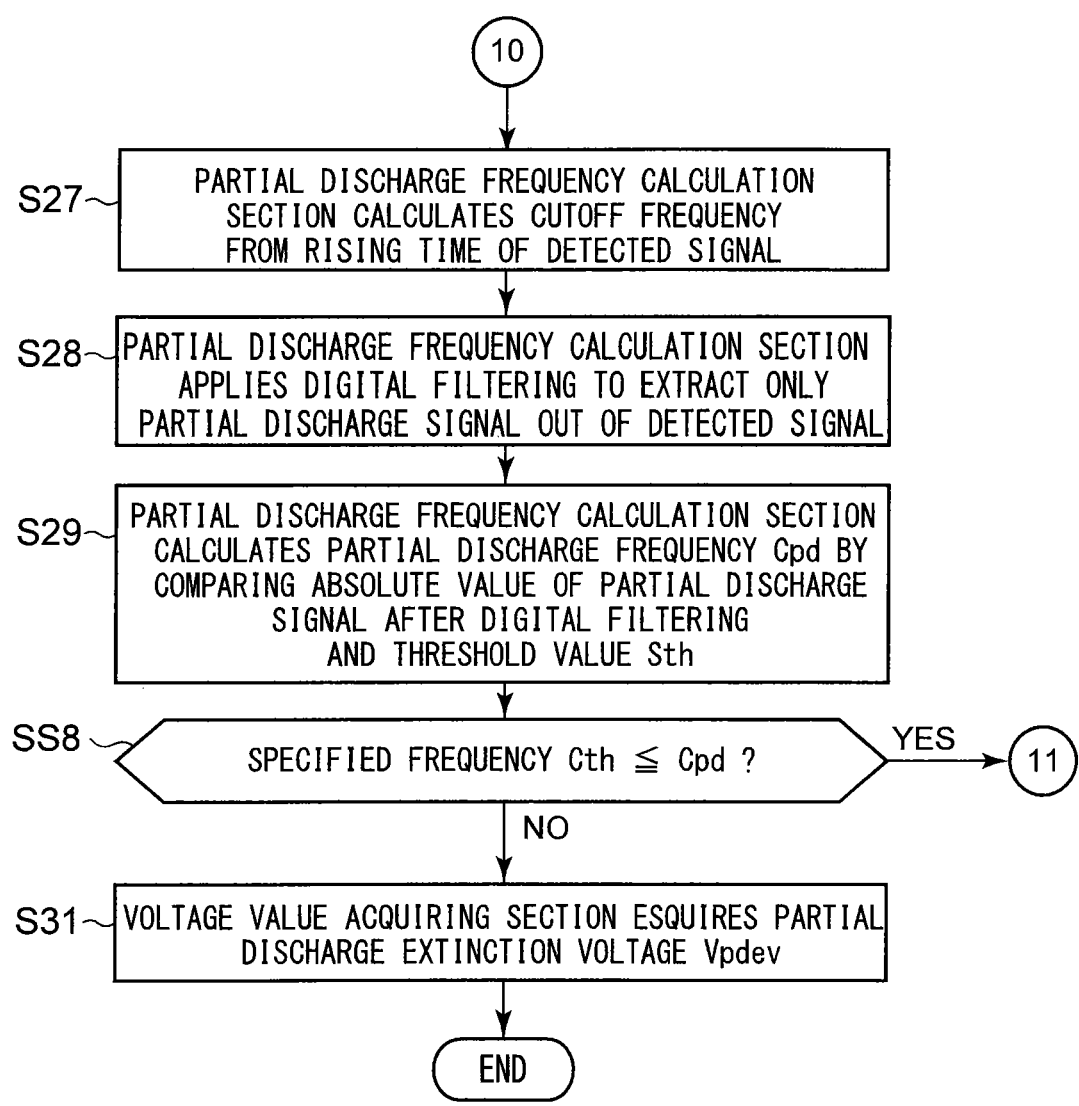
FIG. 9D is a flowchart illustrating a measurement procedure of the partial discharge starting voltage Vpdiv and the partial discharge extinction voltage Vpdev.

FIG. 8 is a block diagram illustrating a schematic configuration of the partial discharge measurement system according to the second embodiment.

The DC power supply 22 of the impulse voltage generator 8 includes, in place of the control DC power supply 8, a control DC power supply 19. The measurement device 5 includes, in place of the voltage instruction section 11 and controller 17, a voltage instruction section 20 and a controller 21, respectively. The control DC power supply 19 is a power supply that can output a ramp voltage, and the voltage instruction section 20 outputs a voltage instruction signal 28 in which a ramp voltage according to a predetermined pulse repetition frequency is set as the above-mentioned instruction voltage Vc to the control DC power supply 19.

FIGS. 9A to 9D are flowcharts each illustrating a measurement procedure of the partial discharge starting voltage Vpdiv and partial discharge extinction voltage Vpdev.

The controller 21 generates the voltage instruction signal 28 in which a start voltage V0 same as the initial voltage V0 of the first embodiment, an upper limit voltage Vu, and a rising time Tu are set (step SS1). Processing from step S2 to step S4 is the same as that illustrated in the flowcharts of FIGS. 2A and 6A. Then, the voltage instruction section 20 outputs the voltage instruction signal 28 in which the start voltage V0, the upper limit voltage Vu, and the rising time Tu are set to the control DC power supply 19 (step SS2). As a result, the control DC power supply 19 starts boosting the initial voltage V0 toward the upper voltage Vu with the rising time Tu (step SS3).

Processing from step S6 to step S11 is the same as that illustrated in the flowcharts of FIGS. 2A, 2B and 6A, 6B.

Then, the controller 21 compares the specified frequency Cth and the partial discharge frequency Cpd transferred from the partial discharge frequency calculation section 15 (step SS4). When the partial discharge frequency Cpd is less than the specified frequency Cth ("NO" in step SS4), the processing flow returns to step S6. On the other hand, when the partial discharge frequency Cpd is equal to or more than the specified frequency Cth ("YES" in step SS4), the processing flow proceeds to step S15, where the controller 21 sets the voltage value calculated by the voltage value acquiring section 13 as the partial discharge starting voltage Vpdiv.

Then, the controller 21 generates the voltage instruction signal 28 in which an end voltage Ve and a descending time Td are set (step SS5). The voltage instruction section 20 outputs the voltage instruction signal 28 in which the end voltage Ve and descending time Td are set to the control DC power supply 19 (step SS6). The control DC power supply 19 starts descending the voltage Vpdiv toward the end voltage Ve with the descending time Td (step SS7).

Hereinafter, processing from step S6 to step S11 is the same as that illustrated in the flowcharts of FIGS. 2A and 2B.

Then, the controller 21 compares the specified frequency Cth and partial discharge frequency Cpd (step SS8). When the partial discharge frequency Cpd is equal to or more than the specified frequency Cth ("YES" in step SS8), the processing flow returns to step S6. On the other hand, when the partial discharge frequency Cpd is less than the specified frequency Cth ("NO" in step SS8), the controller 21 sets the voltage value acquired by the voltage acquisition section 13 as the partial discharge extinction voltage Vpdev in step S31 of FIG. 9D.

FIG. 10 is a timing chart illustrating the rectangular waveform signal 34, the instruction voltage of the ramp output, the high voltage Va, and the impulse voltage Vain.

Figure 11:
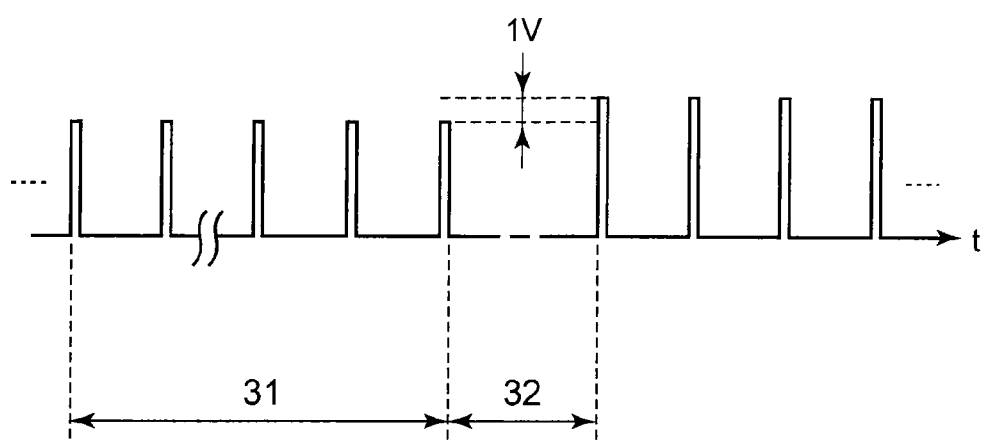
FIG. 11 is a timing chart illustrating an example in which predetermined number of impulse voltage Vain is applied by boosting it by 1 V after 1 V.
Figure 12:
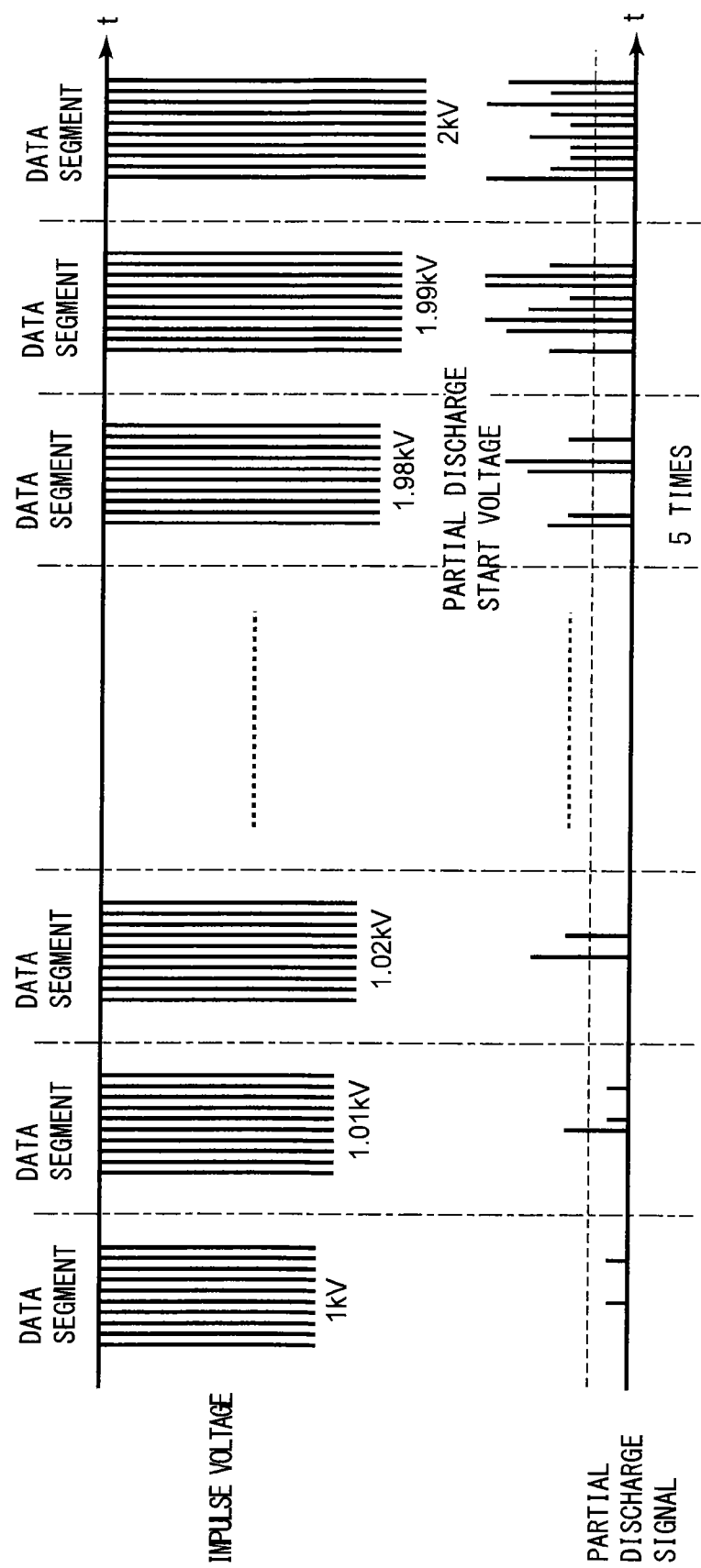
FIG. 12 is a timing chart of an all-period partial discharge measurement method, illustrating an impulse voltage to be applied for each period (data segment in the drawing) to an electric motor (e.g., between phases of a winding) and a partial discharge signal representing the partial discharge generated in the electric motor to which the impulse voltage is applied.

A voltage obtained by multiplying an output voltage of the control DC power supply 19 by a factor A (A is e.g., 3000) is output from the high-voltage DC power supply 7, and the semiconductor switch 9 repeats ON and OFF based on the rectangular waveform signal 34. As a result, the impulse voltage Vain of the ramp output is generated in the impulse voltage generator 3. According to the partial discharge measurement based on the above processing, assuming that the amplification factor of the high-voltage DC power supply 7 is 3000, the start voltage V0 of the ramp voltage output from the control DC power supply 19 is 0.3 V, the upper voltage Vu is 0.7 V, and the rising time is 12 sec, the impulse voltage to be applied to the electric motor 2 is increased at 100 V/sec. Assuming that the pulse width of one impulse voltage Vain is 10 μs, repetition frequency is 10 kHz, and ten impulse voltages Vain are grouped into one block, a time required from the start of the one block to the end thereof is 1 msec, and a boosting voltage in 1 msec is 0.1 V. Since the start voltage which is the minimum voltage applied to the electric motor 2 is 900 V, the boosting voltage of 0.1 V in one block is sufficiently smaller than 900 V and can be negligible. Thus, even in a configuration in which the control DC power supply 19 outputs the ramp voltage, a predetermined number of impulse voltages Vain having substantially the same peak value can be applied. Further, assuming that a time interval between one block (including ten pulses) and the next block is set to, e.g., 10 msec, the impulse voltage Vain is boosted at 1 V in 10 msec. As a result, it is possible to apply a predetermined number of the impulse voltages Vain having substantially the same peak value as illustrated in FIG. 11 to the electric motor 2 while boosting the impulse voltage by 1 V.

As described above, in the partial discharge measurement system according to the present embodiment, control is performed such that the ramp voltage rising in a predetermined rising time is output from the control DC power supply 19, and the pulse width, the repetition frequency, and the predetermined number of the impulse voltage Vain is controlled by the output signal of the signal generator 10, so that it is possible to finely set a rising width between a predetermined number of the impulse voltages Vain having the same peak value and a predetermined number of the impulse voltages in the next block having the same peak value. The finely setting the rising width of the voltage allows the partial discharge starting voltage Vpdiv or partial discharge extinction voltage Vpdev to be measured more accurately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

EXPLANATION OF REFERENCE NUMERALS

1: partial discharge measurement system
2: electric motor (object to be measured)
3: impulse voltage generator
4: partial discharge detector
5: measurement device
6: capacitor
7: high-voltage DC power supply
8: control DC power supply
9: semiconductor switch
10: signal generator
11: voltage instruction section
12: application voltage signal observation circuit
13: voltage value acquiring section
14: detection signal observation circuit
15: partial discharge frequency calculation section
16: signal instruction section
17: controller
18: voltage detector
19: control DC power supply
20: voltage instruction section
21: controller
22: DC power supply
23: resistive element
24: resistive element
25: resistive element
26: output terminal
27: output terminal
28: voltage instruction signal
29: square wave instruction signal
30: period setting signal
31: pulse supply period
32: pulse pause period
33: pulse signal
34: rectangular waveform signal
36: detection signal
37: application voltage signal
38: partial discharge signal

What is claimed is:

1. A partial discharge measurement system based on repeated impulse voltage, the system comprising:
a DC power supply that outputs high voltage as a voltage obtained by multiplying an instruction voltage by a set factor;
a signal generator that generates a pulse signal representing a predetermined pulse width and a predetermined pulse repetition frequency, and superimposes a period setting signal whose one period includes a pulse supply period and a pulse pause period following the pulse supply period and the pulse signal on each other to generate a rectangular waveform signal in which a predetermined number of the pulse signals are generated only in the pulse supply period;
a semiconductor switch that charges a capacitive element with the high voltage from the DC power supply when a voltage value of the rectangular waveform signal is lower than a preset voltage threshold, while applies an impulse voltage having a peak value equal to a value of the high voltage from the capacitive element to an object to be measured when the voltage value of the rectangular waveform signal is equal to or higher than the voltage threshold;
a signal instruction section that outputs, to the signal generator, a square wave instruction signal in which the predetermined pulse width, the predetermined pulse repetition frequency, and the predetermined number are set;
a voltage instruction section that outputs, to the DC power supply, a voltage instruction signal in which an initial voltage is set as the instruction voltage in a first period of the rectangular waveform signal and sets in the voltage instruction signal, in second and subsequent periods, a voltage obtained by adding a predetermined increment voltage lower than the initial voltage to the instruction voltage in the immediately previous period as the instruction voltage;
a detection signal observation circuit that observes a detection signal based on a partial discharge generated in the object to be measured to which the impulse voltages are applied;
a partial discharge frequency calculation section that counts the number of inputs of the detection signal on a per period basis as a partial discharge frequency;
an application voltage signal observation circuit that observes an application voltage signal representing the impulse voltage to be applied to the object to be measured; and
a voltage value acquiring section that sets, in a period in which the partial discharge frequency first becomes equal to or more than a specified frequency, a peak value of a voltage represented by the application voltage signal from the application voltage observation circuit as a partial discharge starting voltage.

2. The partial discharge measurement system based on repeated impulse voltage, according to claim 1, wherein the partial discharge frequency calculation section applies digital filtering to the detection signal to remove an unnecessary signal component from the detection signal so as to extract only a partial discharge signal representing the partial discharge, and counts, on a per period basis, the number of times that the partial discharge signal is extracted as the partial discharge frequency.

3. The partial discharge measurement system based on repeated impulse voltage, according to claim 2, wherein
the partial discharge frequency calculation section calculates a cutoff frequency for use in digital filtering based on a rising time of the detection signal, and applies the digital filtering to the detection signal based on the calculated cutoff frequency.

4. The partial discharge measurement system based on repeated impulse voltage, according to claim 1, wherein
the partial discharge frequency calculation section applies digital filtering to the application voltage signal to remove an unnecessary signal component from the application voltage signal so as to extract only a partial discharge signal representing the partial discharge, and counts, on a per period basis, the number of times that the partial discharge signal is extracted as the partial discharge frequency.

5. The partial discharge measurement system based on repeated impulse voltage, according to claim 4, wherein
the partial discharge frequency calculation section calculates a cutoff frequency for use in digital filtering based on a rising time of the application voltage signal, and applies the digital filtering to the application voltage signal based on the calculated cutoff frequency.

6. The partial discharge measurement system based on repeated impulse voltage, according to claim 2, wherein
the partial discharge frequency calculation section applies digital differential processing to the detection signal to remove the unnecessary signal component from the detection signal so as to extract only the partial discharge signal.

7. The partial discharge measurement system based on repeated impulse voltage according to claim 1, wherein
in a period after a period in which the partial discharge starting voltage is acquired by the voltage value acquiring section, the voltage instruction section outputs, to the DC power supply, the voltage instruction signal in which a voltage obtained by subtracting the predetermined voltage from the instruction voltage in the immediately previous period as the instruction voltage, and
the voltage value acquiring section acquires, as a partial discharge extinction voltage, a peak value of a voltage represented by the application voltage signal from the application voltage signal observation circuit in a period in which the partial discharge frequency first becomes less than the specified frequency after the period in which the partial discharge starting voltage is acquired.

8. The partial discharge measurement system based on repeated impulse voltage according claim 1, wherein
the DC power supply is a power supply that can output a ramp voltage, and
the voltage instruction section outputs, to the DC power supply, the voltage instruction signal in which a ramp voltage according to the predetermined pulse repetition frequency is set as the instruction voltage.

9. A measurement device for a partial discharge measurement system based on repeated impulse voltage, the system including: a DC power supply that outputs high voltage as a voltage obtained by multiplying an instruction voltage by a set factor; a signal generator that generates a pulse signal representing a predetermined pulse width and a predetermined pulse repetition frequency and superimposes a period setting signal whose one period includes a pulse supply period and a pulse pause period following the pulse supply period and the pulse signal on each other to generate a rectangular waveform signal in which a predetermined number of the pulse signals are generated only in the pulse supply period; and a semiconductor switch that charges a capacitive element with the high voltage from the DC power supply when a voltage value of the rectangular waveform signal is lower than a preset voltage threshold, while applies an impulse voltage having a peak value equal to a value of the high voltage from the capacitive element to an object to be measured when the voltage value of the rectangular waveform signal is equal to or higher than the voltage threshold,
the measurement device comprising:
a signal instruction section that outputs, to the signal generator, a square wave instruction signal in which the predetermined pulse width, the predetermined pulse repetition frequency, and the predetermined number are set;
a voltage instruction section that outputs, to the DC power supply, a voltage instruction signal in which an initial voltage is set as the instruction voltage in a first period of the rectangular waveform signal and sets in the voltage instruction signal, in second and subsequent periods, a voltage obtained by adding a predetermined increment voltage lower than the initial voltage to the instruction voltage in the immediately previous period as the instruction voltage;
a detection signal observation circuit that observes a detection signal based on a partial discharge generated in the object to be measured to which the impulse voltages are applied;
a partial discharge frequency calculation section that counts the number of inputs of the detection signal on a per period basis as a partial discharge frequency;
an application voltage signal observation circuit that observes an application voltage signal representing the impulse voltage to be applied to the object to be measured; and
a voltage value acquiring section that sets, in a period in which the partial discharge frequency first becomes equal to or more than a specified frequency, a peak value of a voltage represented by the application voltage signal from the application voltage observation circuit as a partial discharge starting voltage.

10. A measurement method for a partial discharge measurement system based on repeated impulse voltage, the system including: a DC power supply that outputs high voltage as a voltage obtained by multiplying an instruction voltage by a set factor; a signal generator that generates a pulse signal representing a predetermined pulse width and a predetermined pulse repetition frequency, and superimposes a period setting signal whose one period includes a pulse supply period and a pulse pause period following the pulse supply period and the pulse signal on each other to generate a rectangular waveform signal in which a predetermined number of the pulse signals are generated only in the pulse supply period; and a semiconductor switch that charges a capacitive element with the high voltage from the DC power supply when a voltage value of the rectangular waveform signal is lower than a preset voltage threshold, while applies an impulse voltage having a peak value equal to a value of the high voltage from the capacitive element to an object to be measured when the voltage value of the rectangular waveform signal is equal to or higher than the voltage threshold, the measurement method comprising steps of:

outputting, to the signal generator, a square wave instruction signal in which the predetermined pulse width, the predetermined pulse repetition frequency, and the predetermined number are set;

outputting, to the DC power supply, a voltage instruction signal in which an initial voltage is set as the instruction voltage in a first period of the rectangular waveform signal, and setting in the voltage instruction signal, in second and subsequent periods, a voltage obtained by adding a predetermined increment voltage lower than the initial voltage to the instruction voltage in an immediately previous period as the instruction voltage;

observing, using a detection signal observation circuit, a detection signal based on a partial discharge generated in the object to be measured to which the impulse voltages are applied;

counting the number of inputs of the detection signal on a per period basis as a partial discharge frequency;

observing, using an application voltage signal observation circuit, an application voltage signal representing the impulse voltage to be applied to the object to be measured; and setting, in a period in which the partial discharge frequency first becomes equal to or more than a specified frequency, a peak value of a voltage represented by the application voltage signal from the application voltage observation circuit as a partial discharge starting voltage.

* * * * *